(12) United States Patent  
Lu

(10) Patent No.: US 10,714,403 B2  
(45) Date of Patent: Jul. 14, 2020

(54) SEMICONDUCTOR DEVICE PACKAGE WITH PATTERNED CONDUCTIVE LAYERS AND AN INTERCONNECTING STRUCTURE

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/803,387

(22) Filed: Nov. 3, 2017

(65) Prior Publication Data

US 2019/0139846 A1 May 9, 2019

(51) Int. Cl.
*H01L 23/31* (2006.01)
*H01L 21/56* (2006.01)
(Continued)

(52) U.S. Cl.
CPC ...... *H01L 23/3128* (2013.01); *H01L 21/4857* (2013.01); *H01L 21/56* (2013.01); *H01L 21/561* (2013.01); *H01L 23/3121* (2013.01); *H01L 23/3135* (2013.01); *H01L 23/49816* (2013.01); *H01L 23/49822* (2013.01);
(Continued)

(58) Field of Classification Search
CPC .................. H01L 23/3128; H01L 23/3135
See application file for complete search history.

(56) References Cited

U.S. PATENT DOCUMENTS 5,817,545 A * 10/1998 Wang ............... B29C 33/0044
438/127
2011/0233771 A1* 9/2011 Kwon ..................... H01L 22/20
257/737
(Continued)

FOREIGN PATENT DOCUMENTS

CN 101710581 B 12/2012

*Primary Examiner* — Thao X Le
*Assistant Examiner* — Laura M Dykes
(74) *Attorney, Agent, or Firm* — Foley & Lardner LLP

(57) ABSTRACT

At least some embodiments of the present disclosure relate to a semiconductor device package. The semiconductor device package comprises a carrier, a first patterned conductive layer, an interconnection structure, a first semiconductor device, an encapsulant, a second patterned conductive layer, and a passivation layer. The carrier has a first surface and a second surface opposite to the first surface. The first patterned conductive layer is adjacent to the first surface of the carrier. The interconnection structure is disposed on the first patterned conductive layer and electrically connected to the first patterned conductive layer. The first semiconductor device is disposed on the interconnection structure and electrically connected to the interconnection structure. The encapsulant is disposed on the first patterned conductive layer and encapsulates the semiconductor device and the interconnection structure. The second patterned conductive layer is disposed on a top surface and a side surface of the encapsulant and electrically connected to the first patterned conductive layer. The passivation layer is disposed on the second patterned conductive layer and covers the side surface of the encapsulant.

20 Claims, 24 Drawing Sheets

(51) Int. Cl.
*H01L 23/498* (2006.01)
*H01L 21/48* (2006.01)
*H01L 23/538* (2006.01)
*H01L 23/522* (2006.01)
*H01L 23/00* (2006.01)
*H01L 25/18* (2006.01)
*H01L 25/065* (2006.01)
*H01L 25/00* (2006.01)

(52) U.S. Cl.
CPC ...... *H01L 23/5226* (2013.01); *H01L 23/5389* (2013.01); *H01L 23/562* (2013.01); *H01L 25/0655* (2013.01); *H01L 25/18* (2013.01); *H01L 25/50* (2013.01); *H01L 2224/16225* (2013.01); *H01L 2224/97* (2013.01); *H01L 2924/1532* (2013.01); *H01L 2924/15192* (2013.01); *H01L 2924/15311* (2013.01); *H01L 2924/15321* (2013.01); *H01L 2924/3511* (2013.01)

(56) References Cited

U.S. PATENT DOCUMENTS

| | | |
|---|---|---|
| 2013/0249104 A1 | 9/2013 | Chi et al. |
| 2016/0118333 A1 | 4/2016 | Lin |
| 2016/0276307 A1* | 9/2016 | Lin ................... H01L 21/561 |
| 2017/0033027 A1* | 2/2017 | Chen ................ H01L 23/49822 |
| 2017/0033083 A1* | 2/2017 | Lin ................... H01L 23/49838 |
| 2017/0133310 A1* | 5/2017 | Kelly ............... H01L 23/49816 |

\* cited by examiner

_US 10,714,403 B2_

SEMICONDUCTOR DEVICE PACKAGE WITH PATTERNED CONDUCTIVE LAYERS AND AN INTERCONNECTING STRUCTURE

BACKGROUND

1. Technical Field

The present disclosure relates to a semiconductor device package, and to a semiconductor device package having a first patterned conductive layer partially covered by an encapsulant and having a second patterned conductive layer disposed on a side wall and a top surface of the encapsulant and electrically connected to the first patterned conductive layer.

2. Description of the Related Art

In a semiconductor device package, signals can be transmitted from a semiconductor device with a relatively small pitch and a relatively great number of electrical contacts (e.g. around 180,000 (180 k) inputs/outputs (I/Os) to a substrate with a relatively great pitch and a relatively smaller number of electrical contacts (e.g. around 50 k I/Os). The signals may then be transmitted from the substrate to a system board or a printed circuit board (PCB) with a relatively great pitch and a relatively smaller number of electrical contacts (e.g. around 2 k I/Os). The substrate includes a number of redistribution layers (RDLs), which may result in warpage of the semiconductor device package (e.g. during a process involving temperature change, such as a thermal manufacturing process). An interposer can be used to mitigate the warpage issue. However, a thin interposed may be used in keeping with a trend of miniaturization of semiconductor device packages, and the thin interposer may be subject to damage or may be fragile. Moreover, a cost of implementing an interposer can be high.

SUMMARY

In some embodiments, according to one aspect, a semiconductor device package includes a carrier, a first patterned conductive layer, an interconnection structure, a first semiconductor device, an encapsulant, a second patterned conductive layer, and a passivation layer. The carrier has a first surface and a second surface opposite to the first surface. The first patterned conductive layer is adjacent to the first surface of the carrier. The interconnection structure is disposed on the first patterned conductive layer and electrically connected to the first patterned conductive layer. The first semiconductor device is disposed on the interconnection structure and electrically connected to the interconnection structure. The encapsulant is disposed on the first patterned conductive layer and encapsulates the semiconductor device and the interconnection structure. The second patterned conductive layer is disposed on a top surface and a side surface of the encapsulant and is electrically connected to the first patterned conductive layer. The passivation layer is disposed on the second patterned conductive layer and covers the side surface of the encapsulant.

In some embodiments, according to another aspect, a semiconductor device package includes a carrier, a first patterned conductive layer, a first interconnection layer, a second interconnection layer, a first semiconductor device, an encapsulant, a second patterned conductive layer, and a passivation layer. The carrier has a first surface and a second surface opposite to the first surface. The first patterned conductive layer is adjacent to the first surface of the carrier. The first interconnection layer is disposed on the first patterned conductive layer and has a first pitch. The second interconnection layer is disposed on the first interconnection layer and has a second pitch. The first semiconductor device is disposed on the second interconnection layer and is electrically connected to the second interconnection layer. The encapsulant is disposed on the first patterned conductive layer. The second patterned conductive layer is disposed on a side surface and a top surface of the encapsulant and electrically connected to the first patterned conductive layer. The second patterned conductive layer includes a top portion disposed on a top surface of the encapsulant and having a third pitch. The passivation layer is disposed on the second patterned conductive layer and covers the side surface and the top surface of the encapsulant. The first pitch is greater (e.g., about 1.1 or more times greater) than the second pitch and the third pitch is greater (e.g., about 1.1 or more times greater) than the first pitch.

In some embodiments, according to another aspect, a semiconductor device package includes a carrier, a first patterned conductive layer, a first connection layer, a second connection layer, a semiconductor device, an encapsulant, a second patterned conductive layer, and a passivation layer. The carrier has a first surface and a second surface opposite to the first surface. The first patterned conductive layer is adjacent to the first surface of the carrier. The first connection layer is disposed on the first patterned conductive layer and has a first number of connection elements. The second connection layer is disposed on the first connection layer and has a second number of connection elements. The semiconductor device is disposed on the second connection layer. The encapsulant is disposed on the first patterned conductive layer and encapsulates the semiconductor device. The second patterned conductive layer is disposed on a side surface and a top surface of the encapsulant and electrically connected to the first patterned conductive layer. The second patterned conductive layer includes a top portion disposed on the top surface of the encapsulant and including a third number of connection elements. The passivation layer is disposed on the second patterned conductive layer and covers the side surface and the top surface of the encapsulant. The second number of connection elements is greater (e.g., about 1.1 or more times greater) than the first number of connection elements, and the first number of connection elements is greater (e.g., about 1.1 or more times greater) than the third number of connection elements.

In some embodiments, according to another aspect, a method is disclosed for manufacturing a semiconductor device package. The method includes: providing a carrier with a first surface and a second surface opposite to the first surface; forming a first patterned conductive layer on the first surface of the carrier; forming an interconnection structure on the first patterned conductive layer; disposing a semiconductor device on the interconnection structure; forming an encapsulant on the first patterned conductive layer, the encapsulant encapsulating the semiconductor device and the interconnection structure and partially covering the first patterned conductive layer; forming a second patterned conductive layer on a side wall and a top surface of the encapsulant, and the second patterned conductive layer being electrically connected to the first patterned conductive layer; and forming an external connection element on the second patterned conductive layer.

In some embodiments, according to another aspect, a semiconductor device package comprises a dielectric cup, a first patterned conductive layer, an encapsulant, a semiconductor device, a first interconnection layer, and a second interconnection layer. The dielectric cup has a top surface, an inner side surface and an inner bottom surface. The first patterned conductive layer extends from the top surface through the inner side surface to the inner bottom surface of the dielectric cup. The first patterned conductive layer on the inner bottom surface of the dielectric cup has a first pitch. The encapsulant is surrounded by the first patterned conductive layer. The semiconductor device is encapsulated by the encapsulant. The first interconnection layer is disposed on the semiconductor device and electrically connected to the semiconductor device and has a second pitch. The second interconnection layer is disposed on the first interconnection layer and has a third pitch. The first pitch is greater (e.g., about 1.1 or more times greater) than the third pitch and the third pitch is greater (e.g., about 1.1 or more times greater) than the second pitch.

DETAILED DESCRIPTION

Figure 1A:
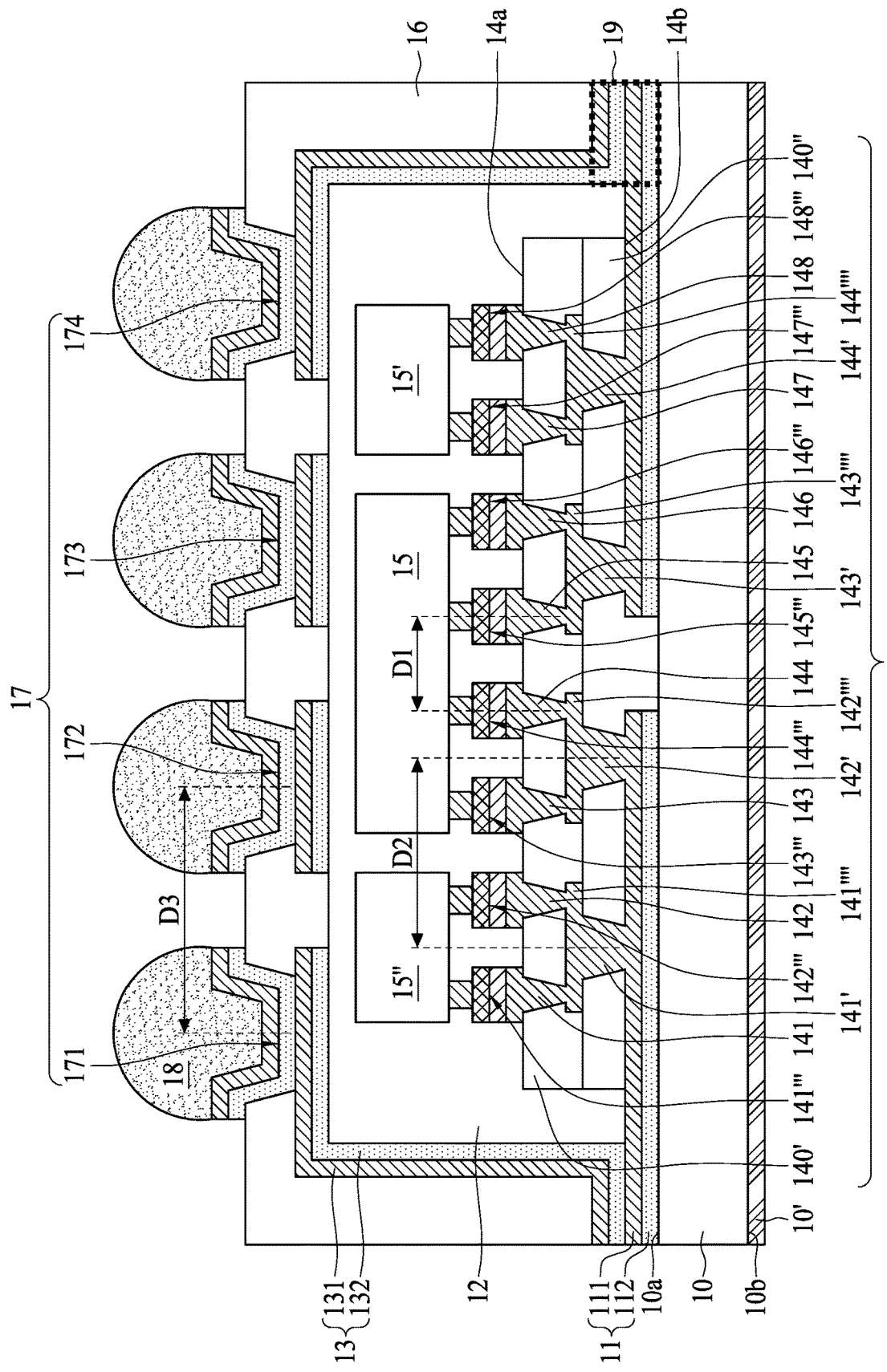
FIG. 1A illustrates a cross-sectional view of a semiconductor device package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1A is a cross-sectional view of a semiconductor device package 1 in accordance with some embodiments of the present disclosure. The semiconductor device package 1 includes a carrier 10, a first patterned conductive layer 11, an encapsulant 12, a second patterned conductive layer 13, an interconnection structure 14, a semiconductor device 15, a semiconductor device 15', a semiconductor device 15", a passivation layer 16, a conductive pad group 17 and an external connection element 18.

The carrier 10 has a surface 10a and a surface 10b opposite to the surface 10a. A stress release layer 10' is disposed on the surface 10b of the carrier 10. A material or a thickness of carrier 10 can be selected to balance stress of the semiconductor device package 1. The stress release layer 10' can be used to balance the stress of the semiconductor device package 1. The material or the thickness of the stress release layer 10' can be selected based on the stress from the carrier. Since the stress release layer 10' is located on a bottom of the semiconductor device package 1, the stress release layer 10' can efficiently remediate the warpage issue of the semiconductor device package 1. The warpage of the semiconductor device package 1 can be remediated or eliminated by selecting appropriate characteristics for the carrier 10 and/or the stress release layer 10'.

The carrier 10 may include organic materials (e.g., Bismaleimide Triazine (BT), a polyimide (PI), an Ajinomoto build-up film (ABF), or other suitable materials) and/or inorganic materials (e.g., silicon, a glass, or other suitable materials). The stress release layer 10' may be a metal layer or a non-metal layer. The stress release layer 10' may include copper (Cu), aluminum (Al), nickel (Ni), titanium (Ti), tungsten (W), lead (Pt), a conductive alloy, or other suitable conductive materials. The stress release layer 10' may include a PI, an ABF, an epoxy, a molding compound, a solder mask ink, or other suitable materials. In some embodiments, the stress release layer 10' may be omitted.

The first patterned conductive layer 11 is adjacent to the surface 10a of the carrier 10. The first patterned conductive layer 11 is disposed on the surface 10a of the carrier 10. The first patterned conductive layer 11 includes a patterned conductive layer 111 and a patterned conductive layer 112. The conductive layer 111 may include Cu, silver (Ag), gold (Au), or other suitable conductive materials. The conductive layer 112 may be a seed layer. The conductive layer 112 may include Ti, a titanium-tungsten alloy (TiW), Ni, Cu, Ag, Au, or other suitable conductive materials.

The interconnection structure 14 has a surface 14a and a surface 14b opposite to the surface 14a. The interconnection structure 14 is disposed on the first patterned conductive layer 11. The interconnection structure 14 is electrically connected to the first patterned conductive layer 11. The interconnection structure 14 may include at least one RDL. The RDL may include a conductive layer. The RDL may include a conductive layer and a dielectric layer. The interconnection structure 14 includes a first dielectric layer 140', a second dielectric layer 140", a plurality of first connection layers including a first connection layer 141, a first connection layer 142, a first connection layer 143, a first connection layer 144, a first connection layer 145, a first connection layer 146, a first connection layer 147, and a first connection layer 148 (first connection layers 141-148), a plurality of second connection layers including a second connection layer 141', a second connection layer 142', a second connection layer 143', and a second connection layer 144' (second connection layers 141'-144'), a plurality of conductive pads including a conductive pad 141''', a conductive pad 142''', a conductive pad 143''', a conductive pad 144''', a conductive pad 145''', a conductive pad 146''', a conductive pad 147''', and a conductive pad 148''' (conductive pads 141'''-148''') and a plurality of wiring layers including a wiring layer 141'''', a wiring layer 142'''', a wiring layer 143'''', and a wiring layer 144'''' (141''''-144''''). In some embodiments, the first dielectric layer 140' may include organic materials (e.g., a molding compound, polyamide (PA), a PI, a polybenzoxazole (PBO), or an epoxy-based material) and/or inorganic materials (e.g., $SiO_x$, $SiN_x$, $TaO_x$). The second dielectric layer 140" may include organic materials (e.g., molding compound, PA, a PI, PBO, or an epoxy-based material) and/or inorganic materials (e.g., $SiO_x$, $SiN_x$, $TaO_x$). The material of the first dielectric layer 140' may be the same as or different from the material of the second dielectric layer 140". Appropriate selection of the materials of the first dielectric layer 140' and the second dielectric layer 140" may remediate or eliminate the warpage issue of the semiconductor device package 1.

The interconnection structure 14 has a fan-in structure from the surface 14a to the surface 14b. The plurality of first connection layers 141-148 are interconnection layers/elements (e.g. vias). The plurality of second connection layers 141'-144' are interconnection layers/elements (e.g. vias). The plurality of wiring layers 141''''-144'''' are interconnection layers/elements. The plurality of first connection layers 141-148 are respectively electrically connected to the plurality of second connection layers 141'-144' through the plurality of wiring layers 141''''-144''''. In some embodiments, the first connection layers 141 and 142 are electrically connected to the second connection layer 141' through the wiring layer 141''''. A width of the wiring layer is less than about 2 micrometers (μm) (e.g. less than about 1.8 μm, less than about 1.6 μm, less than about 1.4 μm, or less than about 1.2 μm). The plurality of conductive pads 141'''-148''' are bump structures on the surface 14a for respectively electrically connecting the interconnection structure 14 to the semiconductor devices 15, 15', and 15". The bump structures 141'''-148''' may include at least one metal layer. The bump structures 141'''-148''' may include two metal layers with different conductive materials. In some embodiments, the semiconductor device 15 is electrically connected to the first patterned conductive layer 11 through the conductive pads 143'''-146''' of the interconnection structure 14. The semiconductor device 15' is electrically connected to the first patterned conductive layer 11 through the conductive pads 147'''-148''' of the interconnection structure 14. The semiconductor device 15" is electrically connected to the first patterned conductive layer 11 through the conductive pads 141'''-142''' of the interconnection structure 14. In some embodiments, the function of the semiconductor device 15 may be different from the function of the semiconductor device 15'. The function of the semiconductor device 15' may be the same as or different from the function of the semiconductor device 15".

The plurality of first connection layers 141-148 have a pitch D1. The plurality of second connection layers 141'-144' have a pitch D2. The distance between the first connection layer 144 and the first connection layer 145 defines the pitch D1. The pitch D1 may be an interconnection pitch. The distance between the second connection layer 141' and the second connection layer 142' defines the pitch D2. The pitch D2 may be an interconnection pitch. The pitch D2 is greater than the pitch D1 (e.g. the pitch D2 is about 1.1 times the pitch D1 or greater, is about 1.2 times the pitch D1 or greater, is about 1.3 times the pitch D1 or greater, is about 1.4 times the pitch D1 or greater, or is about 1.5 times the pitch D1 or greater).

In some embodiments, a number of the plurality of first connection layers/electrical contacts (I/Os) (such as layers 141-148) for the electrical connection to semiconductor devices may be around several hundred thousands, such as from around 180 k to around 360 k (I/Os). A number of the plurality of conductive pads 141'''-148''' may correspond to the number of the plurality of first connection layers 141-148. A number of the plurality of second connection layers/electrical contacts (I/Os) (such as layers 141'-144') on the carrier 10 may be around several ten thousands, such as from around 20 k to 50 k (I/Os). The number of first connection layers/electrical contacts (I/Os) may be greater than the number of second connection layers/electrical contacts (I/Os) (e.g. the number of first connection layers/electrical contacts (I/Os) may be about 1.1 or more times greater than the number of second connection layers/electrical contacts (I/Os).

The encapsulant 12 is disposed on the first patterned conductive layer 11. The encapsulant 12 encapsulates the semiconductor devices 15, 15' and 15" and the interconnection structure 14. The encapsulant 12 partially covers the first patterned conductive layer 11. The encapsulant 12 has a top surface, a bottom surface, and a side surface. A projective area of the encapsulant 12 on the carrier (e.g. a footprint of the encapsulant 12) is smaller than an area of the carrier 10 (e.g. a top or bottom surface area of the carrier).

The second patterned conductive layer 13 is disposed on the top surface and the side surface of the encapsulant 12. The second patterned conductive layer 13 includes a patterned conductive layer 131 and a patterned conductive layer 132. The conductive layer 131 may include Cu, Ag, Au, an alloy thereof, or other suitable conductive materials. The conductive layer 132 may be a seed layer. The conductive layer 132 may include Ti, TiW, Ni, Cu, Ag, Au, an alloy thereof, or other suitable conductive materials.

The second patterned conductive layer 13 comprises a protruding portion protruding away from the encapsulant 12 and disposed on the first patterned conductive layer 11. The first patterned conductive layer 11 comprises a protruding portion protruding away from the encapsulant 12 and electrically connected to the second patterned conductive layer 13. The protruding portion of the first patterned conductive layer 11 and the protruding portion of the second patterned conductive layer 13 form a turning pad 19. The turning pad 19 comprises the seed layer 112 disposed on the carrier 10, the patterned conductive layer 111 disposed on the seed layer 112, the seed layer 132 disposed on the patterned conductive layer 111, and the patterned conductive layer 131 disposed on the seed layer 132. The structure of the turning pad 19 has a low sheet resistance.

The patterned portions of the second patterned conductive layer 13 disposed on the top surface of the encapsulant 12 may be connection elements/layers. The patterned portions of the second patterned conductive layer 13 disposed on the top surface of the encapsulant 12 may be interconnection elements/layers. The patterned portions of the second patterned conductive layer 13 disposed on the top surface of the encapsulant 12 may be pads or traces. The patterned portions of the second patterned conductive layer 13 on the top surface of the encapsulant 12, which can constitute a top patterned portion of the second patterned conductive layer 13, have a pitch D3. The pitch D3 of the second patterned conductive layer 13 is greater than the pitch D1 of the plurality of first connection layers 141-148 (e.g. the pitch D3 is about 1.1 times the pitch D1 or greater, is about 1.2 times the pitch D1 or greater, is about 1.3 times the pitch D1 or greater, is about 1.4 times the pitch D1 or greater, or is about 1.5 times the pitch D1 or greater). The pitch D3 of the second patterned conductive layer 13 is greater than the pitch D2 of the second connection layers 141'-144' (e.g. the pitch D3 is about 1.1 times the pitch D2 or greater, is about 1.2 times the pitch D2 or greater, is about 1.3 times the pitch D2 or greater, is about 1.4 times the pitch D2 or greater, or is about 1.5 times the pitch D2 or greater). The second patterned conductive layer 13 has a fan-in structure from the first patterned conductive layer 11 to the top surface of the encapsulant 12.

The passivation layer 16 is disposed on the second patterned conductive layer 13 and covers the side surface and the top surface of the encapsulant 12. The passivation layer 16 defines one or more openings to partially expose the second patterned conductive layer 13. In some embodiments, the passivation layer 16 may include organic materials (e.g., a molding compound, PA, a PI, PBO, or an epoxy-based material) and/or inorganic materials (e.g., $SiO_x$, $SiN_x$, $TaO_x$). The passivation layer 16 and the second patterned conductive layer 13 may form an RDL. Appropriate selection of the materials of the passivation layer 16 may remediate or eliminate the warpage issue of the semiconductor device package 1.

The external connection element 18 is correspondingly disposed on the conductive pad group 17. The semiconductor device package 1 may include one or more external connection elements 18. The external connection element 18 may be a ball grid array (BGA), a land grid array (LGA), or a bump. The conductive pad group 17 includes a conductive pad 171, a conductive pad 172, a conductive pad 173, and a conductive pad 174 (conductive pads 171-174). The conductive pads 171-174 are correspondingly disposed in the openings of the passivation layer 16. The conductive pads 171-174 are correspondingly disposed on the patterned portions of the second patterned conductive layer 13. The conductive pads 171-174 are connection elements. The conductive pads 171-174 are external connection elements. The conductive pads 171-174 include a pitch substantially corresponding to the pitch D3. The conductive pads 171-174 may include at least one metal layer. The conductive pads 171-174 may include two metal layers with different conductive materials.

In some embodiments, a number of the patterned portions of the second patterned conductive layer 13/electrical contacts (I/Os) disposed on the top surface of the encapsulant 12 may be around several ten thousands, such as from around 20 k to around 50 k (I/Os). Since the second patterned conductive layer 13 is disposed on the top surface of the encapsulant 12, the number of the patterned portions of the second patterned conductive layer 13 may be selected according to design specifications. The number of the plurality of first connection layers/electrical contacts (I/Os) (such as layers 141-148) is greater than the number of the plurality of second connection layers/electrical contacts (I/Os) (such as layers 141'-144') (e.g. is about 1.1 times greater or more, is about 1.2 times greater or more, is about 1.3 times greater or more, is about 1.4 times greater or more, or is about 1.5 times greater or more). The number of the plurality of second connection layers/electrical contacts (I/Os) (such as layers 141'-144') is greater than the number of the patterned portions of the second patterned conductive layer 13/electrical contacts (I/Os) (such as the portions corresponding to the conductive pads 171-174) (e.g. is about 1.1 times greater or more, is about 1.2 times greater or more, is about 1.3 times greater or more, is about 1.4 times greater or more, or is about 1.5 times greater or more). In some embodiments, the number of the plurality of second connection layers/electrical contacts (I/Os) (such as layers 141'-144') may be substantially the same as the number of the patterned portions of the second patterned conductive layer 13/electrical contacts (I/Os) (such as the portions corresponding to the conductive pads 171-174).

By implementing the structure of the semiconductor device package 1, a relatively large number of electrical contacts (I/Os) are able to be obtained. Additionally, the warpage issue of the semiconductor device package 1 is able to be remediated or eliminated without using a through silicon via (TSV). A total thickness of the semiconductor device package 1 is able to be kept small such that an arrangement of the electrical contacts (I/Os) can be flexibly selected.

Figure 1B:
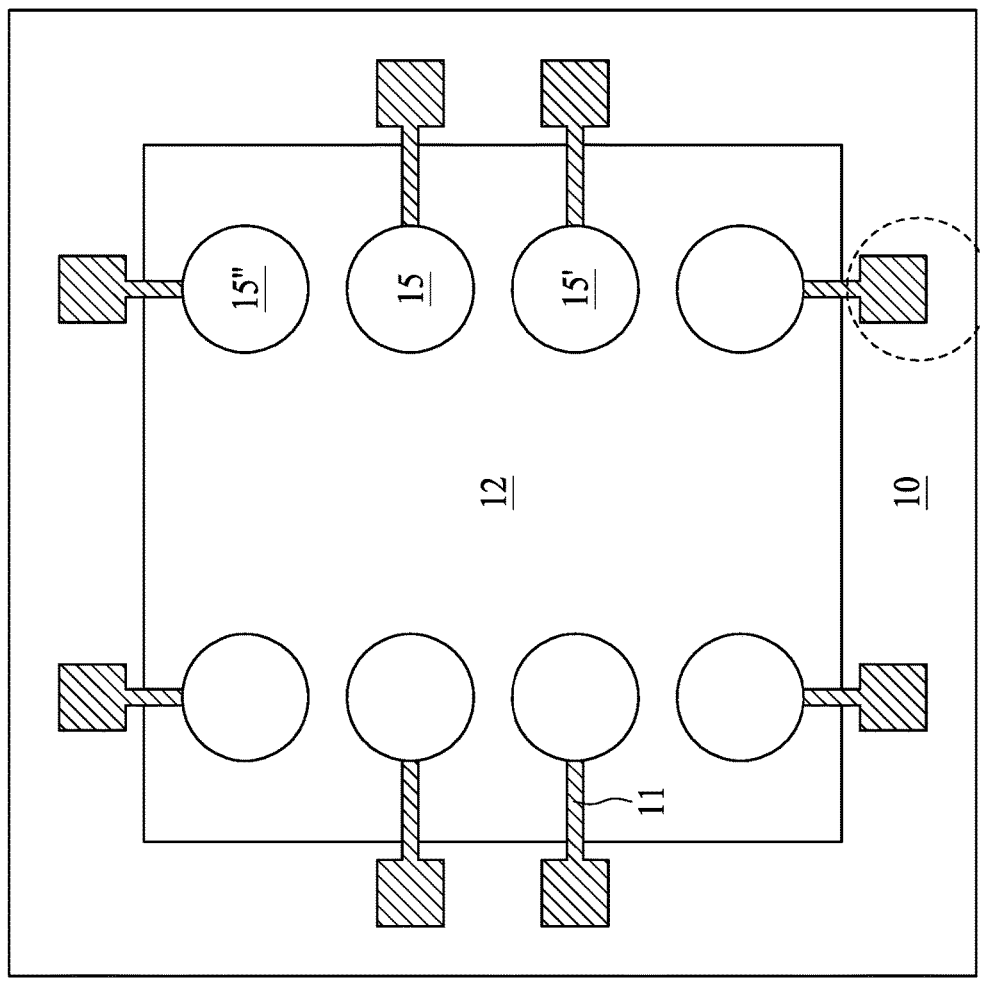
FIG. 1B illustrates a cross-sectional view of a layout of semiconductor device package according to some embodiments of the present disclosure.

FIG. 1B is a cross-sectional view of a layout of semiconductor device package 1 according to some embodiments of the present disclosure. The semiconductor devices 15, 15' and 15" are electrically connected to an outside environment or device through the turning pads 19. Since the structure of the turning pad 19 has four metal layers, the total sheet resistance can be kept small. Additionally, a space between the turning pads 19 may be flexibly selected or designed.

Figure 2:
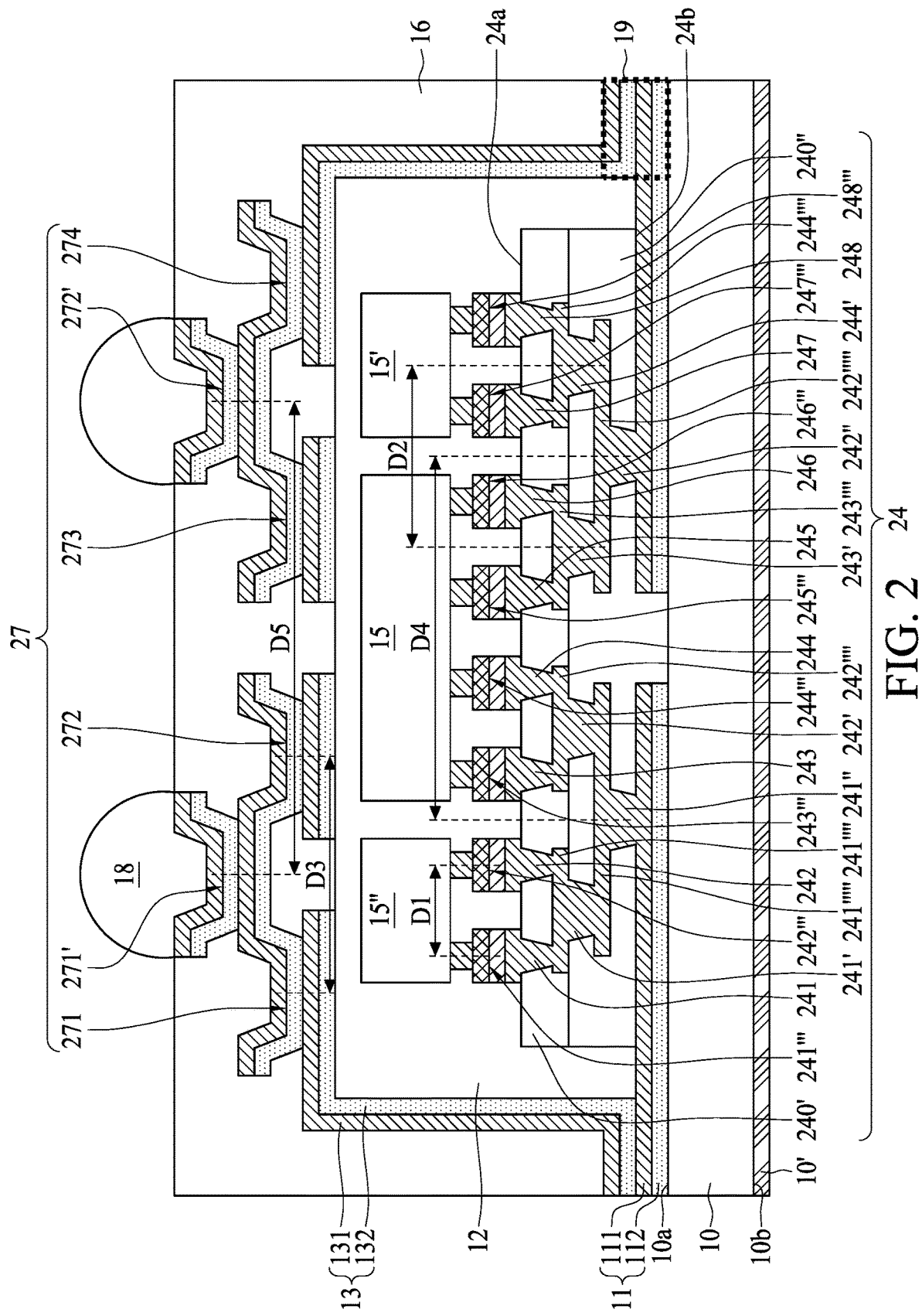
FIG. 2 illustrates a cross-sectional view of a semiconductor device package according to some embodiments of the present disclosure.

FIG. 2 is a cross-sectional view of a semiconductor device package 2 in accordance with some embodiments of the present disclosure. The semiconductor device package 2 includes a carrier 10, a first patterned conductive layer 11, an encapsulant 12, a second patterned conductive layer 13, an interconnection structure 24, a semiconductor device 15, a semiconductor device 15', a semiconductor device 15", a passivation layer 16, a conductive pad group 27 and an external connection element 18.

The depicted structure of FIG. 2 is similar to the structure depicted in FIG. 1, except that the interconnection structure 24 of FIG. 2 includes three sets of connection layers/elements and that the conductive pad group 27 includes conductive pads including a conductive pad 271, a conductive pad 272, a conductive pad 273, a conductive pad 274 (conductive pads 271-274), a conductive pad 271', and a conductive pad 272' (conductive pads 271'-272').

The interconnection structure 24 includes a first dielectric layer 240', a second dielectric layer 240", a plurality of first connection layers including a first connection layer 241, a first connection layer 242, a first connection layer 243, a first connection layer 244, a first connection layer 245, a first connection layer 246, a first connection layer 247, and a first connection layer 248 (first connection layers 241-248), a plurality of second connection layers including a second connection layer 241', a second connection layer 242', a second connection layer 243', a second connection layer 244' (second connection layers 241'-244'), a plurality of third connection layers including a third connection layer 241" and a third connection layer 242" (third connection layers 241"-242"), a plurality of conductive pads including a conductive pad 241''', a conductive pad 242''', a conductive pad 243''', a conductive pad 244''', a conductive pad 245''', a conductive pad 246''', a conductive pad 247''', and a conductive pad 248''' (conductive pads 241'''-248''') and a plurality of wiring layers including a wiring layer 241'''', a wiring layer 242'''', a wiring layer 243'''', and a wiring layer 244'''' (wiring layers 241''''-244'''') and a wiring layer 241''''' and a wiring layer 242''''' (wiring layers 241'''''-242'''''). In some embodiments, the first dielectric layer 240' may include organic materials (e.g., a molding compound, PA, a PI, PBO, or an epoxy-based material) and/or inorganic materials (e.g., $SiO_x$, $SiN_x$, $TaO_x$). The second dielectric layer 240" may include organic materials (e.g., a molding compound, PA, a PI, PBO, or an epoxy-based material) and/or inorganic materials (e.g., $SiO_x$, $SiN_x$, $TaO_x$). The material of the first dielectric layer 240' may be the same as or different from the material of the second dielectric layer 240". Appropriate selection of materials of the first dielectric layer 240' and the second dielectric layer 240" may remediate or eliminate the warpage issue of the semiconductor device package 2.

In some embodiments, the plurality of first connection layers 241-248 may have a pitch D1. The plurality of second connection layers 241'-244' have a pitch D2. The plurality of second connection layers 241"-242" have a pitch D4. The distance between the first connection layer 241 and the first connection layer 242 defines the pitch D1. The pitch D1 may be an interconnection pitch. The distance between the second connection layer 243' and the second connection layer 244' defines the pitch D2. The pitch D2 may be an interconnection pitch. The distance between the third connection layer 241" and the third connection layer 242" defines the pitch D4. The pitch D4 is greater than the pitch D2 (e.g. the pitch D4 is about 1.1 times the pitch D2 or greater, is about 1.2 times the pitch D2 or greater, is about 1.3 times the pitch D2 or greater, is about 1.4 times the pitch D2 or greater, or is about 1.5 times the pitch D2 or greater). The pitch D2 is greater than the pitch D1 (e.g. the pitch D2 is about 1.1 times the pitch D1 or greater, is about 1.2 times the pitch D1 or greater, is about 1.3 times the pitch D1 or greater, is about 1.4 times the pitch D1 or greater, or is about 1.5 times the pitch D1 or greater).

In some embodiments, a number of the plurality of first connection layers/electrical contacts (I/Os) (such as layers 241-248) for the electrical connection to semiconductor devices may be around several hundred thousands, such as from around 180 k to around 360 k (I/Os). A number of the plurality of second connection layers/electrical contacts (I/Os) (such as layers 241'-248') between the plurality of first connection layers 241-248 and the plurality of third connection layers 241"-242" may be around several ten thousands, such as from around 20 k to 50 k (I/Os). A number of the plurality of third connection layers/electrical contacts (I/Os) (such as layers 241"-242") on the carrier 10 may be around several thousands, such as from around 2 k to 5 k (I/Os).

The external connection element 18 is disposed on the conductive pad group 27. The conductive pad group 27 includes conductive pads 271-274 and 271'-272'. The conductive pads 271-274 and 271'-272' are disposed in the passivation layer 16. The conductive pads 271-274 are respectively disposed on the patterned portions of the second patterned conductive layer 13. The conductive pads 271-274 are connection elements. The conductive pads 271-274 are internal connection elements. The conductive pads 271'-272' are external connection elements. The conductive pads 271-274 include a pitch substantially corresponding to the pitch D3. The conductive pads 271'-272' include a pitch D5. The pitch D5 is greater than the pitch D3 (e.g. the pitch D5 is about 1.1 times the pitch D3 or greater, is about 1.2 times the pitch D3 or greater, is about 1.3 times the pitch D3 or greater, is about 1.4 times the pitch D3 or greater, or is about 1.5 times the pitch D3 or greater). The pitch D5 is greater than the pitch D4. (e.g. the pitch D5 is about 1.1 times the pitch D4 or greater, is about 1.2 times the pitch D4 or greater, is about 1.3 times the pitch D4 or greater, is about 1.4 times the pitch D4 or greater, or is about 1.5 times the pitch D4 or greater). The pitch D3 may be greater than or about equal to the pitch D4 (e.g. the pitch D3 is about 1.1 times the pitch D4 or greater, is about 1.2 times the pitch D4 or greater, is about 1.3 times the pitch D4 or greater, is about 1.4 times the pitch D4 or greater, or is about 1.5 times the pitch D4 or greater). The conductive pads 271-274 and 271'-272' may include at least one metal layer. The conductive pads 271-274 and 271'-272' may include two metal layers with different conductive materials. The passivation layer 16, the second patterned conductive layer 13 and the conductive pads 271-274 and 271'-272' may form an RDL. The number of electrical contacts (I/Os) in the RDL can be flexibly selected. The number of the conductive pads 271'-272'/electrical contacts (I/Os) may be selected for the RDL according to design specifications.

In some embodiments, a number of the patterned portions of the second patterned conductive layer 13/electrical contacts (I/Os) disposed on the top surface of the encapsulant 12 may be around several ten thousands, such as from around 20 k to around 50 k (I/Os). A number of the plurality of the conductive pads 271'-272'/electrical contacts (I/Os) may be around several thousands, such as from around 2 k to 5 k (I/Os). The number of the plurality of first connection layers 241-248/electrical contacts (I/Os) is greater than the number of the plurality of second connection layers 241'-244'/electrical contacts (I/Os) (e.g. is about 1.1 times greater or more, is about 1.2 times greater or more, is about 1.3 times greater or more, is about 1.4 times greater or more, or is about 1.5 times greater or more). The number of the plurality of second connection layers 241'-244'/electrical contacts (I/Os) is greater than the number of the plurality of third connection layers 241"-242"/electrical contacts (I/Os) (e.g. is about 1.1 times greater or more, is about 1.2 times greater or more, is about 1.3 times greater or more, is about 1.4 times greater or more, or is about 1.5 times greater or more). The number of the plurality of second connection layers 241'-244'/electrical contacts (I/Os) is greater than or about equal to the number of the patterned portions of the second patterned conductive layer 13/electrical contacts (I/Os) (such as the portions corresponding to the conductive pads 271-274) (e.g. is about 1.1 times greater or more, is about 1.2 times greater or more, is about 1.3 times greater or more, is about 1.4 times greater or more, or is about 1.5 times greater or more). In some embodiments, the number of the plurality of third connection layers 241"-242"/electrical contacts (I/Os) may be greater than or substantially the same as the number of the conductive pads 271'-272'/electrical contacts (I/Os) (e.g. is about 1.1 times greater or more, is about 1.2 times greater or more, is about 1.3 times greater or more, is about 1.4 times greater or more, or is about 1.5 times greater or more). By implementing the structure of the semiconductor device package 2, the number of the electrical contacts (I/Os) can be readily and flexibly designed and selected.

Figure 3:
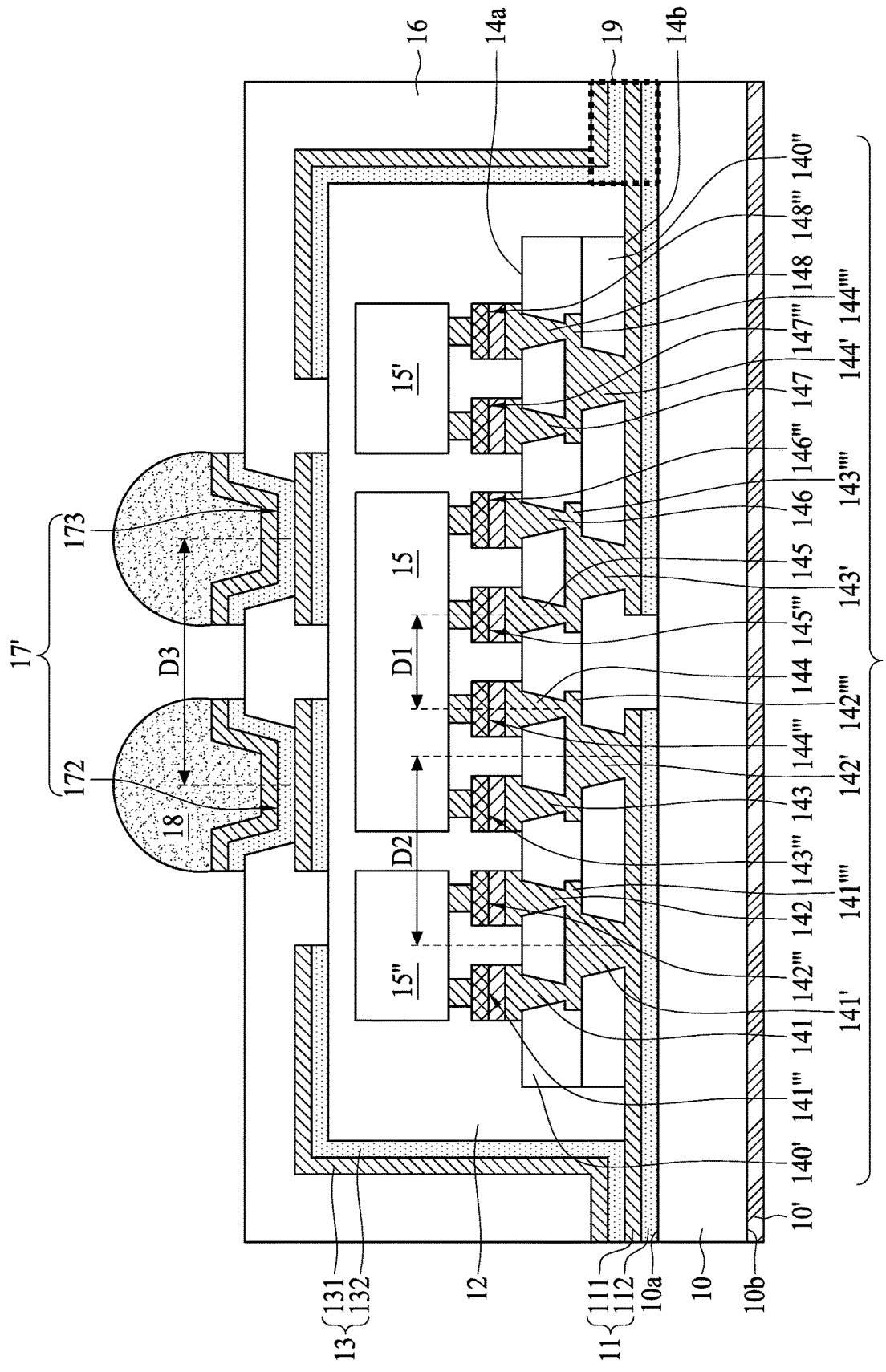
FIG. 3 illustrates a cross-sectional view of a semiconductor device package according to some embodiments of the present disclosure.

FIG. 3 is a cross-sectional view of a semiconductor device package 3 in accordance with some embodiments of the present disclosure. The semiconductor device package 3 includes a carrier 10, a first patterned conductive layer 11, an encapsulant 12, a second patterned conductive layer 13, an interconnection structure 14, semiconductor devices 15, 15', 15", a passivation layer 16, a conductive pad group 17' and an external connection element 18.

The depicted structure of FIG. 3 is similar to the structure depicted in FIG. 1, except that the conductive pad group 17' of FIG. 3 includes the conductive pad 172 and the conductive pad 173. The structure of the second patterned conductive layer 13 and the conductive pad group 17' is a fan-in structure.

Figure 4:
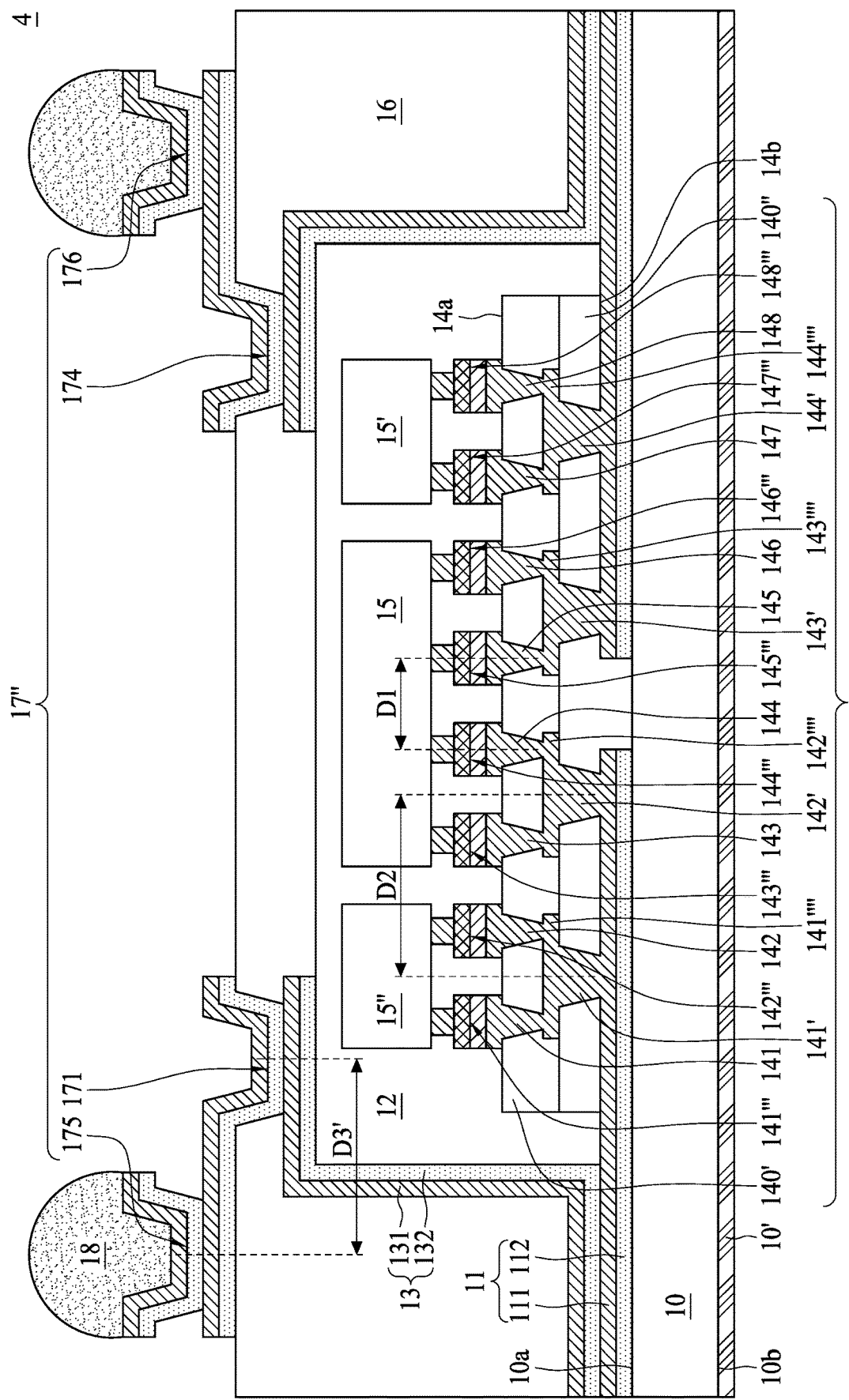
FIG. 4 illustrates a cross-sectional view of a semiconductor device package according to some embodiments of the present disclosure.

FIG. 4 is a cross-sectional view of a semiconductor device package 4 in accordance with some embodiments of the present disclosure. The semiconductor device package 4 includes a carrier 10, a first patterned conductive layer 11, an encapsulant 12, a second patterned conductive layer 13, an interconnection structure 14, semiconductor devices 15, 15', 15", a passivation layer 16, a conductive pad group 17" and an external connection element 18.

The depicted structure of FIG. 4 is similar to the structure depicted in FIG. 1, except that the conductive pad group 17" of FIG. 4 includes the conductive pad 171, the conductive pad 174, the conductive pad 175, and the conductive pad 176. The structure of the second patterned conductive layer 13 and the conductive pad group 17" is a fan-out structure.

Figure 5:
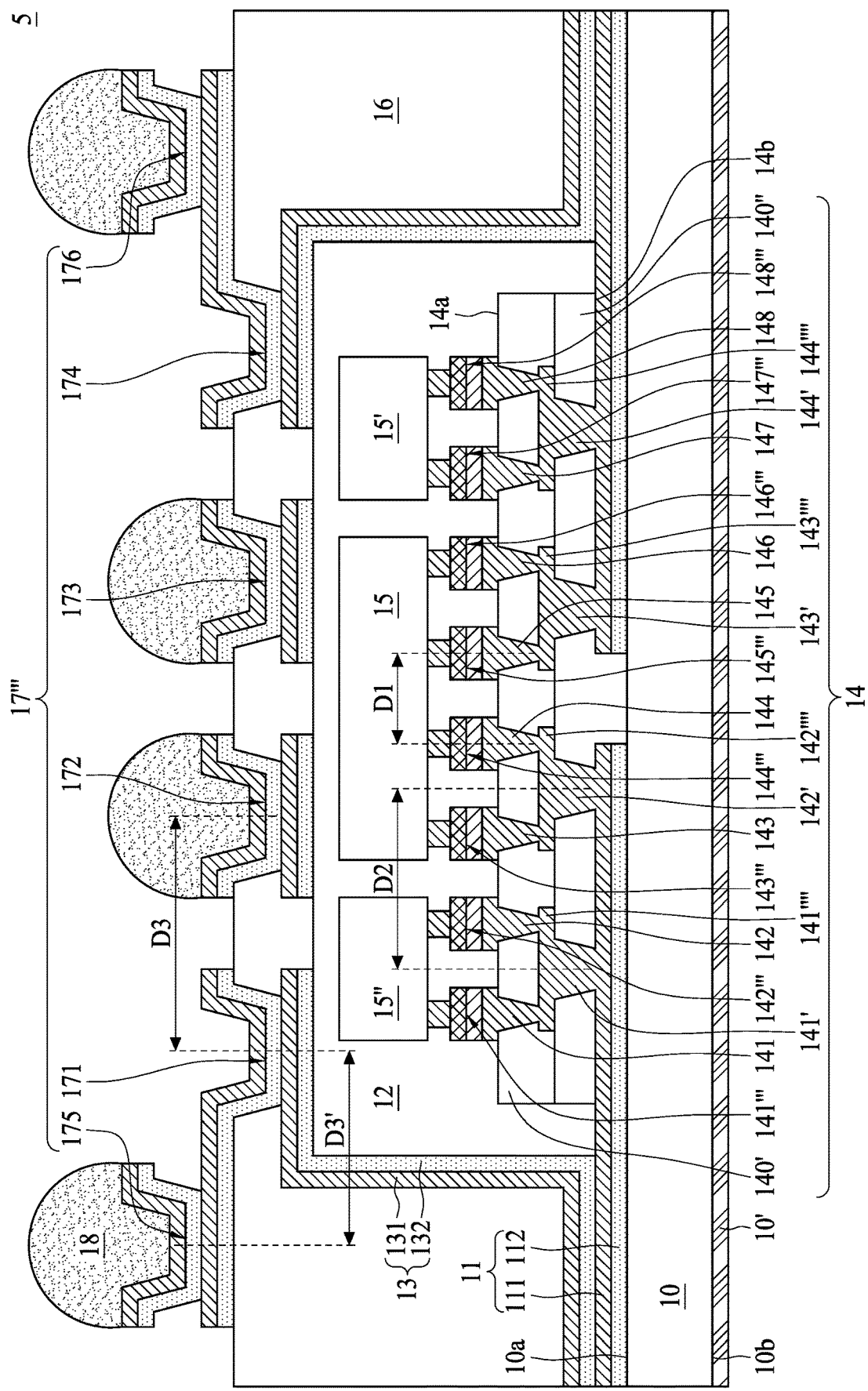
FIG. 5 illustrates a cross-sectional view of a semiconductor device package according to some embodiments of the present disclosure.

FIG. 5 is a cross-sectional view of a semiconductor device package 5 in accordance with some embodiments of the present disclosure. The semiconductor device package 5 includes a carrier 10, a first patterned conductive layer 11, an encapsulant 12, a second patterned conductive layer 13, an interconnection structure 14, semiconductor devices 15, 15', 15", a passivation layer 16, a conductive pad group 17''' and an external connection element 18.

The depicted structure of FIG. 5 is similar to the structure depicted in FIG. 1, except that the conductive pad group 17''' of FIG. 5 includes the conductive pad 171, the conductive pad 172, the conductive pad 173, the conductive pad 174, the conductive pad 175, the conductive pad 176 (conductive pads 171-176). The structure of the second patterned conductive layer 13 and the conductive pad group 17" is a fan-out structure.

Figure 6:
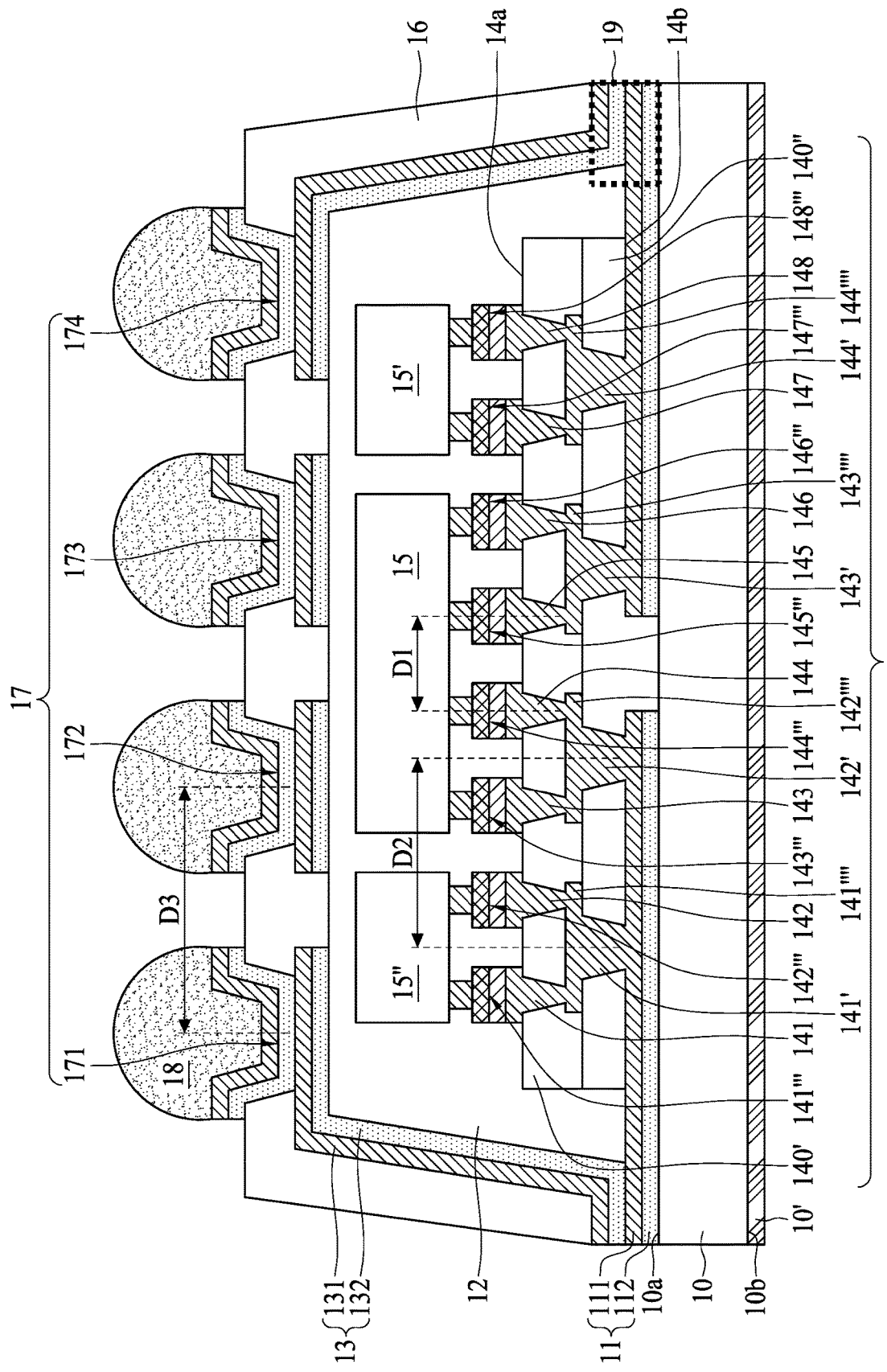
FIG. 6 illustrates a cross-sectional view of a semiconductor device package according to some embodiments of the present disclosure.

FIG. 6 is a cross-sectional view of a semiconductor device package 6 in accordance with some embodiments of the present disclosure. The semiconductor device package 5 includes a carrier 10, a first patterned conductive layer 11, an encapsulant 12, a second patterned conductive layer 13, an interconnection structure 14, semiconductor devices 15, 15', 15", a passivation layer 16, a conductive pad group 17 and an external connection element 18.

The depicted structure of FIG. 6 is similar to the structure depicted in FIG. 1, except that the encapsulant 12 of FIG. 6 is substantially trapezoid shaped. The trapezoid shape of the encapsulant 12 of FIG. 6 provides for a readily demolded the semiconductor device package 6 from a molding chase.

Figure 7:
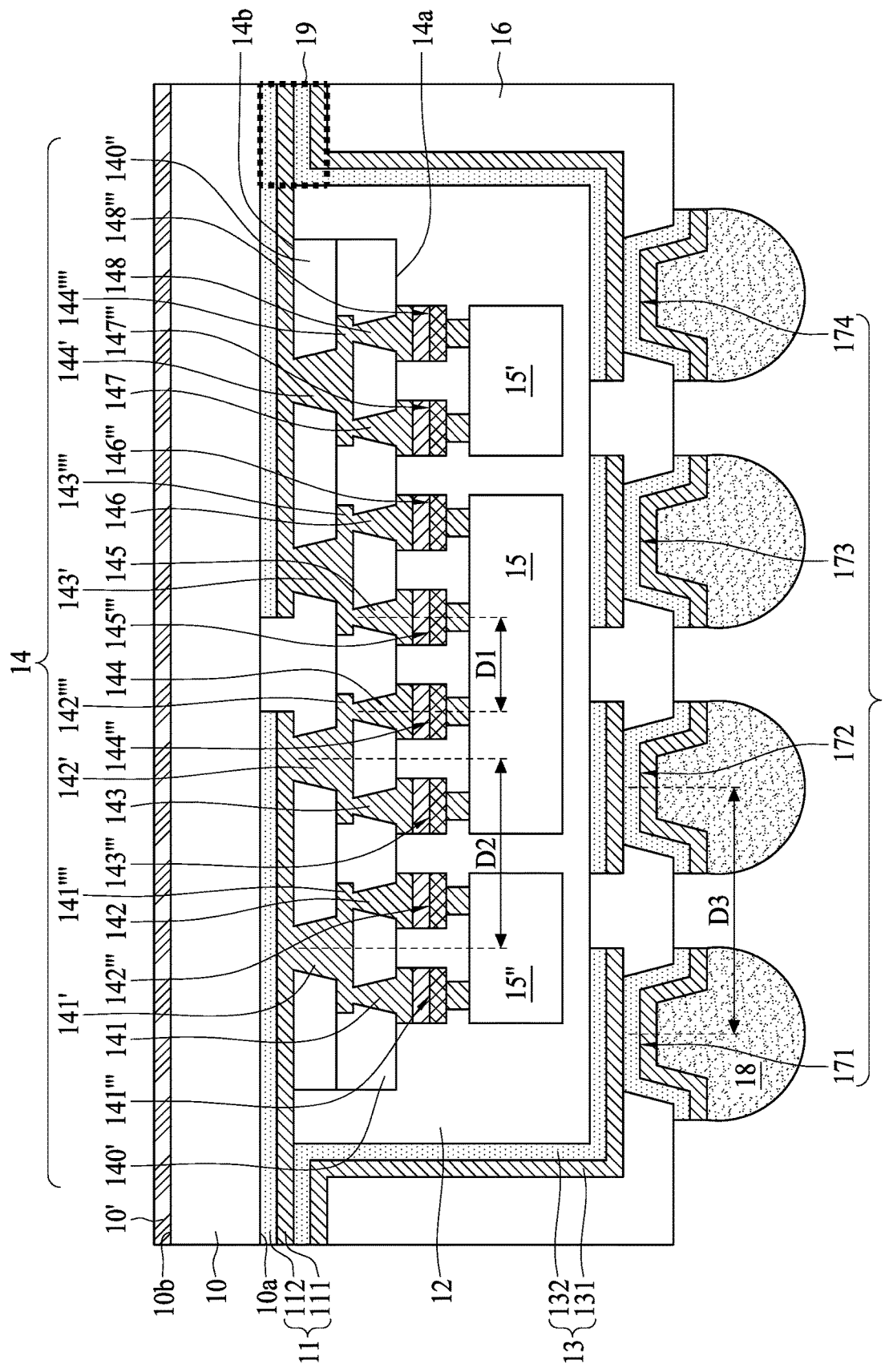
FIG. 7 illustrates a cross-sectional view of a semiconductor device package according to some embodiments of the present disclosure.

FIG. 7 is a cross-sectional view of a reverse semiconductor device package 1 in accordance with some embodiments of the present disclosure.

The passivation layer 16 is a dielectric cup or a dielectric bowl, or other dielectric base. The dielectric cup 16 has a top surface, a bottom surface, an inner side surface and an inner bottom surface. The conductive pad group 17 is disposed in openings defined by the dielectric cup 16 (e.g. openings in the bottom surface). The external connection element 18 is respectively attached to the conductive pads of the conductive pad group 17 and electrically connected to the second patterned conductive layer 13 through the conductive pad group 17.

The second patterned conductive layer 13 extends from the top surface of the dielectric cup 16 through the inner side surface of the dielectric cup 16 to the inner bottom surface of the dielectric cup 16. The second patterned conductive layer 13 on the inner bottom surface of the dielectric cup 16 has a pitch D3. The number of the patterned portions of the second patterned conductive layer 13/electrical contacts (I/Os) disposed on the top surface of the passivation layer 16 may be around several ten thousands, such as from around 20 k to around 50 k (I/Os).

The encapsulant 12 is surrounded by the second patterned conductive layer 13. The semiconductor devices 15, 15', 15" are encapsulated by the encapsulant 12. The interconnection structure 14 is disposed in the encapsulant 12. The interconnection structure 14 is disposed on the semiconductor devices 15, 15', 15".

The first interconnection layers 141-148 are disposed on at least one of the semiconductor devices 15, 15', 15". The first interconnection layers 141, 142 are electrically connected to the semiconductor device 15" through the conductive pads 141''', 142'''. The first interconnection layers 143-146 are electrically connected to the semiconductor device 15 through the conductive pads 143'''-146'''. The first interconnection layers 147, 148 are electrically connected to the semiconductor device 15' through the conductive pads 147''', 148'''. The first interconnection layers 141-148 have the pitch D1. The second interconnection layer 141'-144' are disposed on the first interconnection layer 141-148. The second interconnection layer 141'-144' have the pitch D2.

The pitch D3 is greater than the pitch D2 (e.g. the pitch D3 is about 1.1 times the pitch D2 or greater, is about 1.2 times the pitch D2 or greater, is about 1.3 times the pitch D2 or greater, is about 1.4 times the pitch D2 or greater, or is about 1.5 times the pitch D2 or greater). The pitch D2 is greater than the pitch D1 (e.g. the pitch D2 is about 1.1 times the pitch D1 or greater, is about 1.2 times the pitch D1 or greater, is about 1.3 times the pitch D1 or greater, is about 1.4 times the pitch D1 or greater, or is about 1.5 times the pitch D1 or greater). The first interconnection layers 141-148 are disposed in the dielectric layer 140'. The second interconnection layer 141'-144' are disposed in the dielectric layer 140".

The number of the plurality of first connection layers 141-148/electrical contacts (I/Os) may be around several hundred thousands, such as from around 180 k to around 360 k (I/Os). The number of the plurality of conductive pads 141'''-148''' may substantially correspond to the number of the plurality of first connection layers 141-148. The number of the plurality of second connection layers 141'-144'/electrical contacts (I/Os) adjacent to the carrier 10 may be around several ten thousands, such as from around 20 k to 50 k (I/Os).

The first patterned conductive layer 11 is disposed on the interconnection structure 14. The first patterned conductive layer 11 is disposed on the second interconnection layer 141'-144' and electrically connected to the second patterned conductive layer 13. The turning pad 19 is disposed on the top surface of the dielectric cup 16.

The carrier 10 is a cap (e.g. a first cap). The cap 10 is disposed on the first patterned conductive layer 11. The stress release layer 10' is a cap (e.g. a second cap). The cap 10' is disposed on the surface 10b of the cap 10. The material of the cap 10 is different from the material of the cap 10'.

Figure 8:
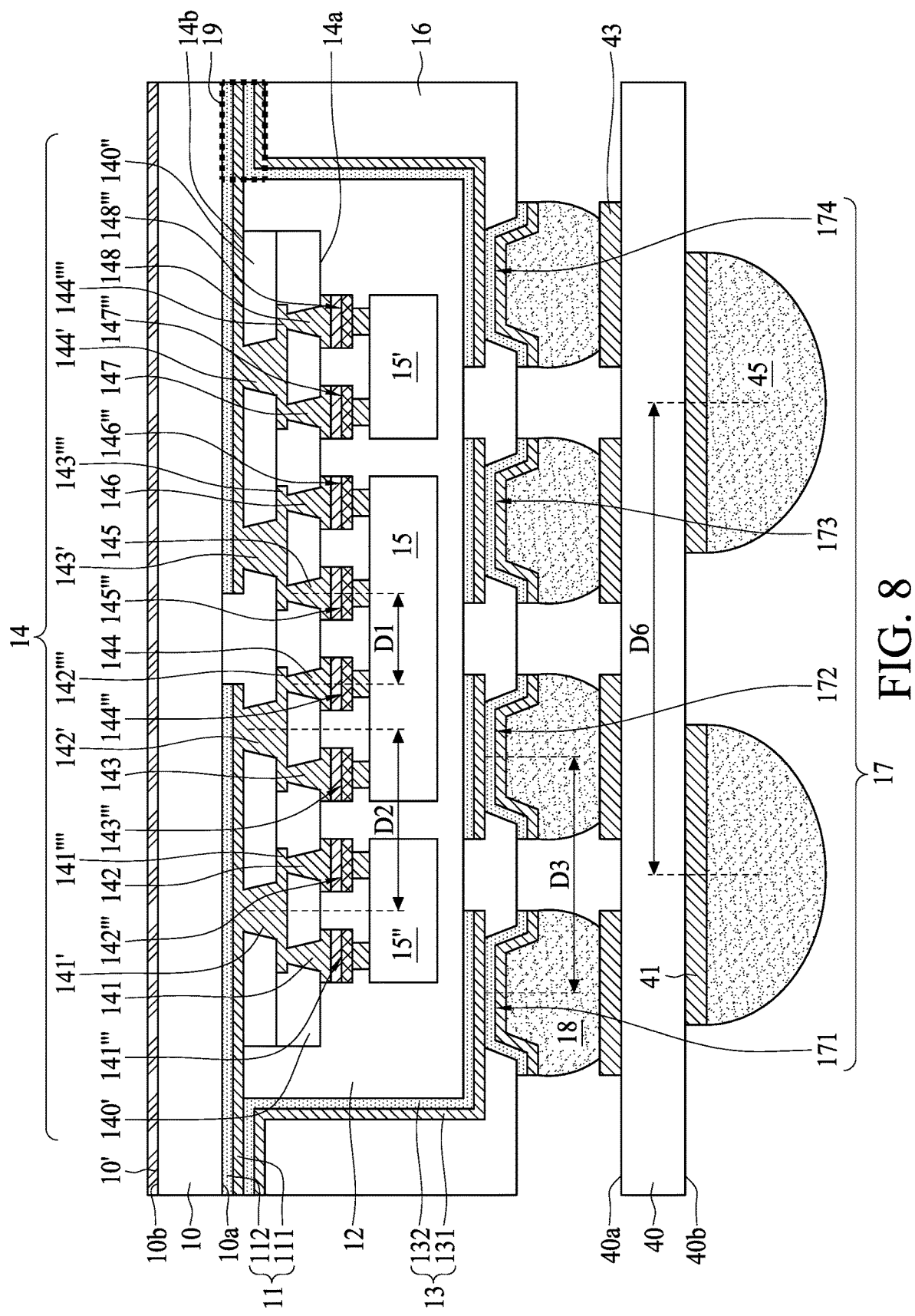
FIG. 8 illustrates a cross-sectional view of a semiconductor device package according to some embodiments of the present disclosure.

FIG. 8 is a cross-sectional view of a semiconductor device package 7 in accordance with some embodiments of the present disclosure. The depicted structure of FIG. 8 is similar to the structure depicted in FIG. 7, except that the semiconductor device package 7 further comprises a carrier 40 connected to the external connection element 18.

The carrier 40 has a surface 40a and a surface 40b opposite to the surface 40a. A conductive pad 41 is disposed on the surface 40b of the carrier 40. A conductive pad 43 is disposed on the surface 40a of the carrier 40. An external connection element 45 is electrically connected to the conductive pad 41. One or more conductive pads 41 have a pitch D6. The pitch D6 of the conductive pads 41 is greater than the pitch D3 (e.g. the pitch D6 is about 1.1 times the pitch D3 or greater, is about 1.2 times the pitch D3 or greater, is about 1.3 times the pitch D3 or greater, is about 1.4 times the pitch D3 or greater, or is about 1.5 times the pitch D3 or greater).

The carrier 40 may include organic materials (e.g., BT, a PI, an ABF, or other suitable materials) and/or inorganic materials (e.g., silicon, a glass, or other suitable materials).

Figure 9:
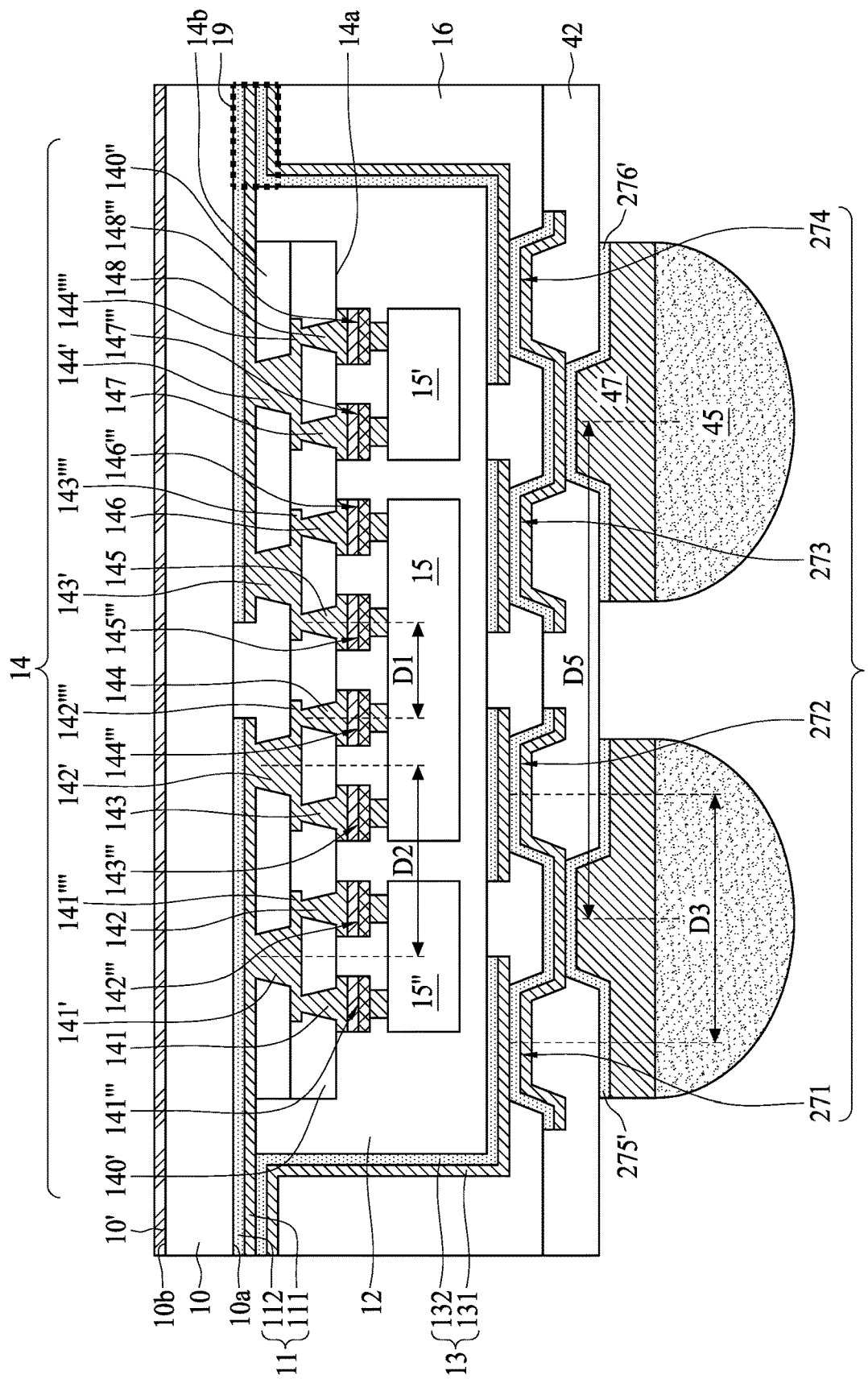
FIG. 9 illustrates a cross-sectional view of a semiconductor device package according to some embodiments of the present disclosure.

FIG. 9 is a cross-sectional view of a semiconductor device package 8 in accordance with some embodiments of the present disclosure. The depicted structure of FIG. 9 is similar to the structure depicted in FIG. 8, except that the semiconductor device package 8 omits the external connection element 18 and the carrier 40 and includes a conductive pad group 27' and a dielectric layer 42.

The dielectric layer 42 may be an organic layer (e.g. including BT, an ABF, or a PI). The conductive pad group 27' includes conductive pads 271-274, 275', 276'. The external connection elements 45 are electrically connected to the conductive pads 275', 276' through a conductive layer 47. The conductive pads 271-274 have a pitch D3. The conductive pads 275', 276' have a pitch D5. The pitch D5 may be about equal to the pitch D3. The pitch D5 may be greater than or less than the pitch D3 (e.g. the pitch D5 is about 1.1 times the pitch D3 or greater, is about 1.2 times the pitch D3 or greater, is about 1.3 times the pitch D3 or greater, is about 1.4 times the pitch D3 or greater, or is about 1.5 times the pitch D3 or greater).

Figure 10B:
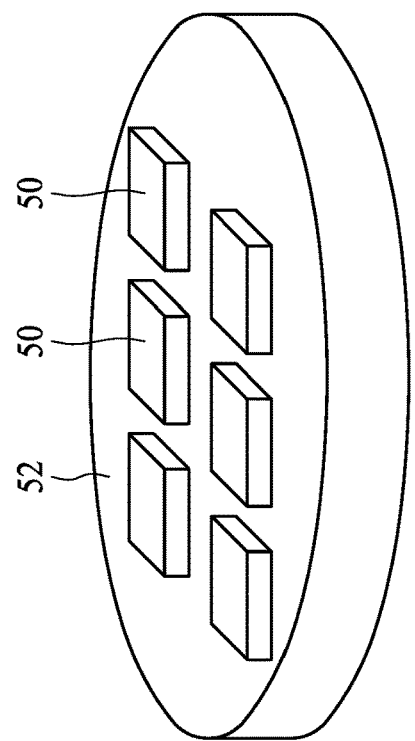
FIG. 10B illustrates a type of a carrier for semiconductor package devices in accordance with some embodiments of the present disclosure.
Figure 10A:
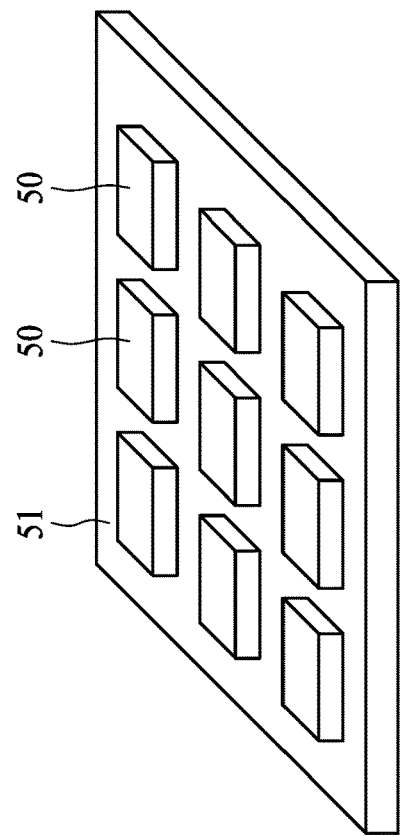
FIG. 10A illustrates a type of a carrier for semiconductor package devices in accordance with some embodiments of the present disclosure.

FIG. 10A shows a type of a carrier for semiconductor package devices in accordance with some embodiments of the present disclosure.

As shown in FIG. 10A, a plurality of semiconductor devices 50 or dies are placed on a substantially square-shaped carrier 51 (e.g. in accordance with one or more embodiments described herein). In some embodiments, the carrier 51 may include organic materials (e.g., a molding compound, BT, a PI, PBO, a solder resist, an ABF, a polypropylene (PP) or an epoxy-based material) and/or inorganic materials (e.g., silicon, a glass, a ceramic or quartz).

FIG. 10B shows another type of a carrier for semiconductor package devices in accordance with some embodiments of the present disclosure.

As shown in FIG. 10B, a plurality of semiconductor devices 50 or dies are placed on a substantially circle-shaped carrier 52 (e.g. in accordance with one or more embodiments described herein). In some embodiments, the carrier 52 may include organic materials (e.g., a molding compound, BT, a PI, PBO, a solder resist, an ABF, a PP or an epoxy-based material) and/or inorganic materials (e.g., silicon, a glass, a ceramic or quartz).

FIG. 11A through FIG. 11L illustrate a method of manufacturing the semiconductor device package 1 or the semiconductor device package 7 according to some embodiments of the present disclosure.

Figure 11A:
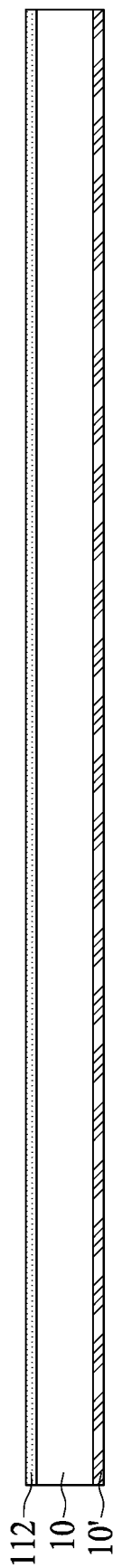
FIG. 11A illustrates a method of manufacturing a semiconductor device package according to some embodiments of the present disclosure.

Referring to FIG. 11A, a method for manufacturing the semiconductor device package 1 or the semiconductor device package 7 includes providing a carrier 10 with a stress release layer 10'. A seed layer 112 is formed on, or provided on the carrier 10.

Figure 11B:
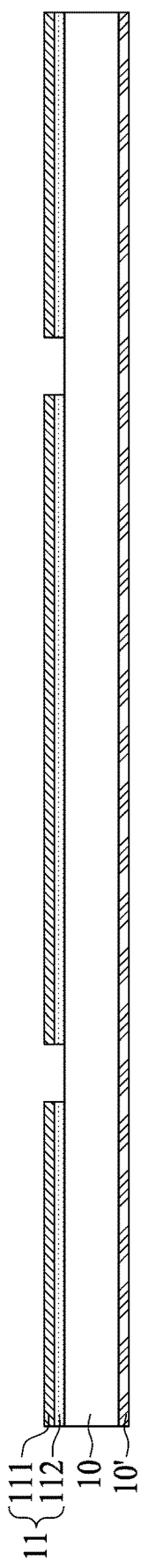
FIG. 11B illustrates a method of manufacturing a semiconductor device package according to some embodiments of the present disclosure.

Referring to FIG. 11B, a conductive layer 111 is formed on the seed layer 112. The seed layer 112 can enhance adhesion at an interface between the conductive layer 111 and carrier 10. The conductive layer 111 and the seed layer 112 are patterned by etching operations so as to form a first patterned conductive layer 11.

Figure 11C:
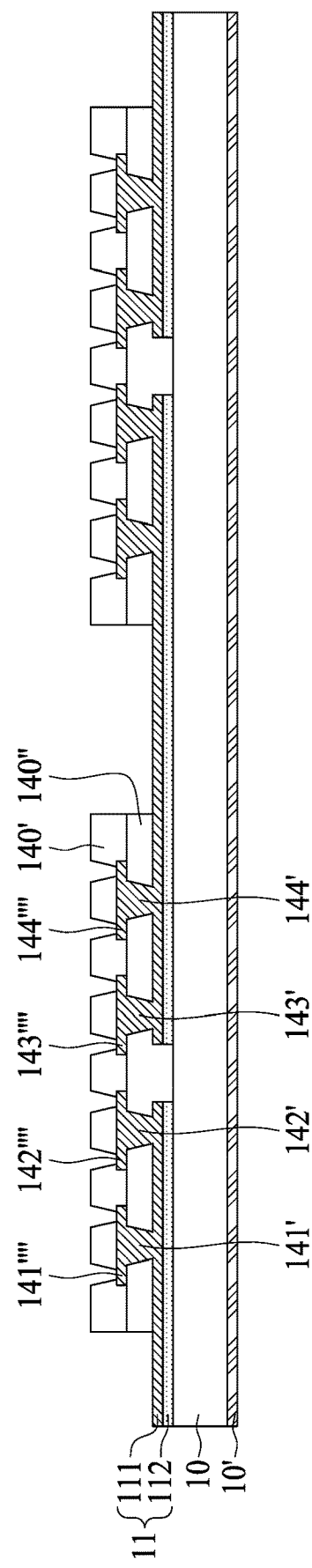
FIG. 11C illustrates a method of manufacturing a semiconductor device package according to some embodiments of the present disclosure.

Referring to FIG. 11C, a first dielectric layer 140', a second dielectric layer 140", a plurality of wiring layers 141""-144"", and a plurality of second connection layers 141'-144' are formed on the first patterned conductive layer 11. In some embodiments, the second dielectric layer 140" and the plurality of second connection layers 141'-144' may form an RDL.

Figure 11D:
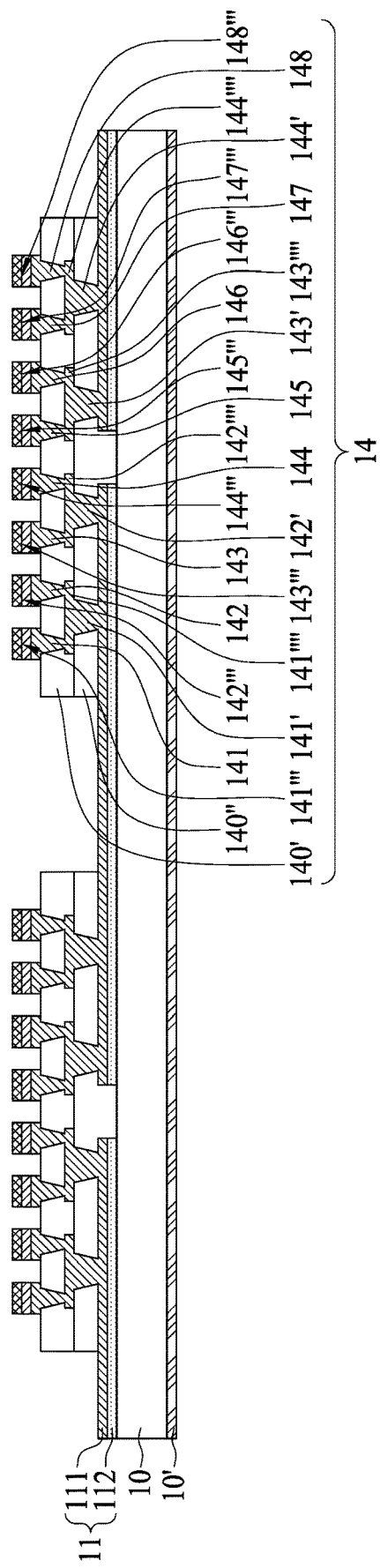
FIG. 11D illustrates a method of manufacturing a semiconductor device package according to some embodiments of the present disclosure.

Referring to FIG. 11D, a plurality of first connection layers 141-148 are correspondingly formed on the plurality of wiring layers 141""-144"". A plurality of conductive pads 141'''-148''' are correspondingly formed on the plurality of first connection layers 141-148 so as to form an interconnection structure 14. In some embodiments, the first dielectric layer 140', the plurality of first connection layers 141-148, and the plurality of wiring layers 141""-144"" may form an RDL. The plurality of first connection layers 141-148 and the plurality of second connection layers 141'-144' are solid conductive vias.

Figure 11E:
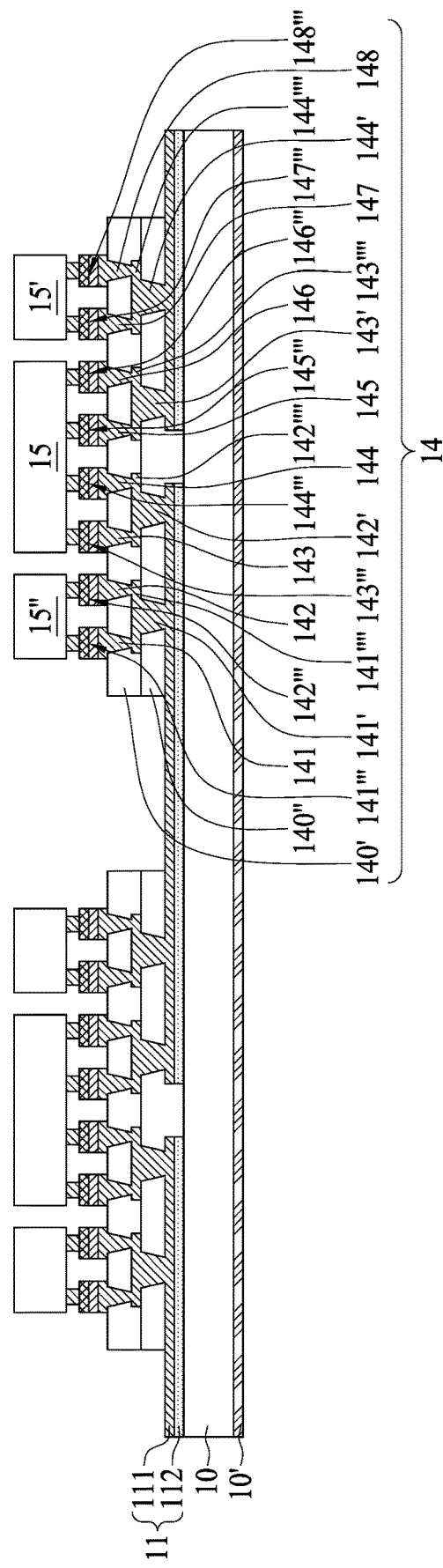
FIG. 11E illustrates a method of manufacturing a semiconductor device package according to some embodiments of the present disclosure.

Referring to FIG. 11E, semiconductor devices 15, 15', 15" are attached to the interconnection structure 14. The semiconductor device 15 is electrically connected to the first patterned conductive layer 11 through the conductive pads 143'''-146'''. The semiconductor device 15' is electrically connected to the first patterned conductive layer 11 through the conductive pads 147'''-148'''. The semiconductor device 15'' is electrically connected to the first patterned conductive layer 11 through the conductive pads 141'''-142'''.

Figure 11F:
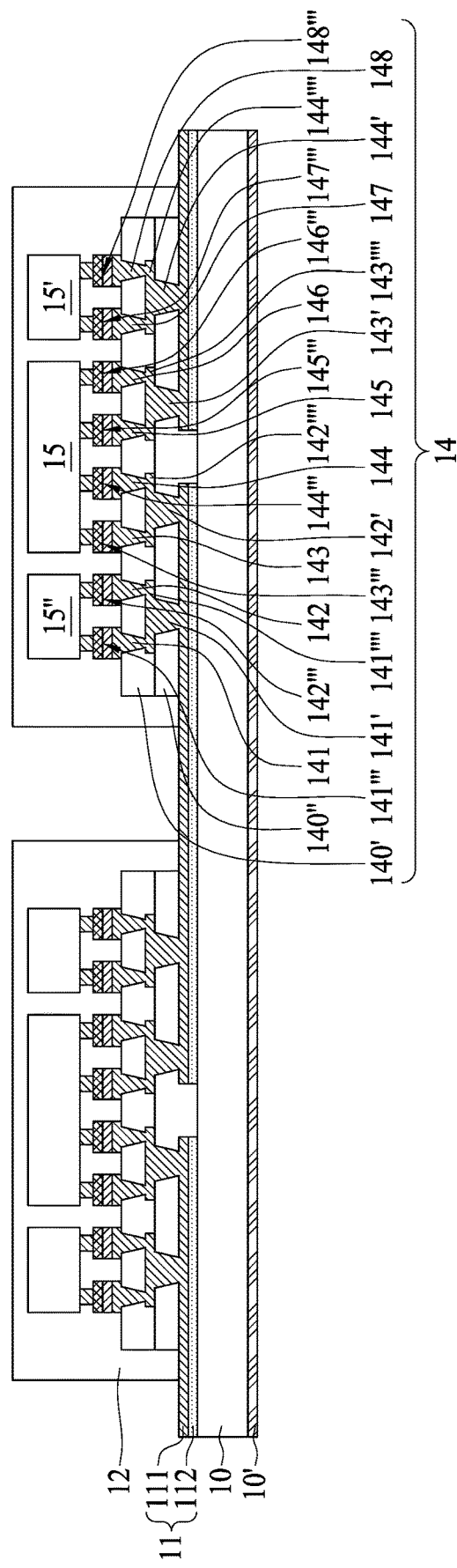
FIG. 11F illustrates a method of manufacturing a semiconductor device package according to some embodiments of the present disclosure.

Referring to FIG. 11F, an encapsulant 12 is disposed on the first patterned conductive layer 11. The encapsulant 12 encapsulates the semiconductor devices 15, 15', 15'' and the interconnection structure 14.

Figure 11G:
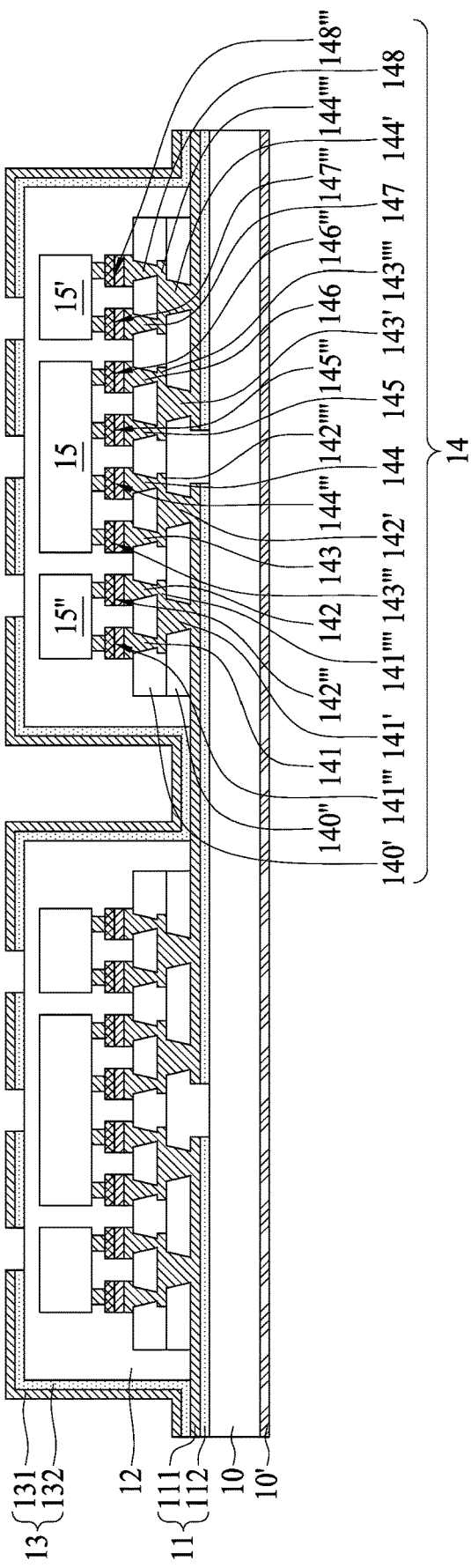
FIG. 11G illustrates a method of manufacturing a semiconductor device package according to some embodiments of the present disclosure.

Referring to FIG. 11G, a seed layer 132 is formed on the encapsulant 12 and the first patterned conductive layer 11. A conductive layer 131 is formed on the seed layer 132. The conductive layer 131 and the seed layer 132 are patterned by etching operations so as to form the second patterned conductive layer 13.

Figure 11H:
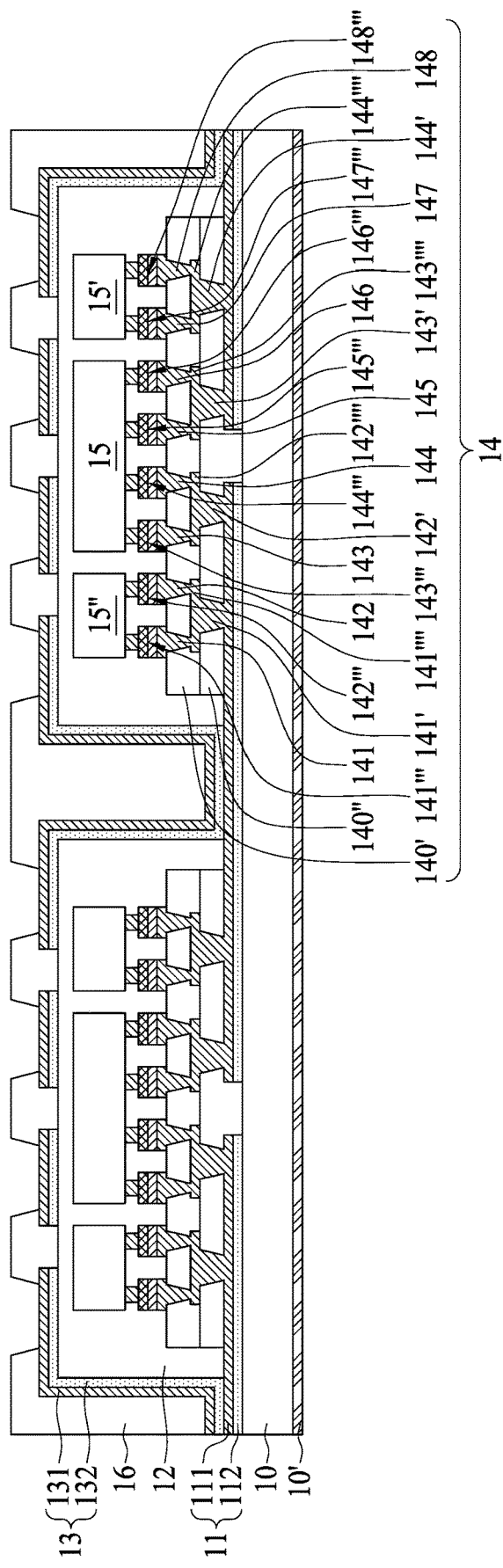
FIG. 11H illustrates a perspective view of a substrate array according to some embodiments of the present disclosure.

Referring to FIG. 11H, a passivation layer 16 is disposed on the second patterned conductive layer 13. The passivation layer 16 is patterned by photolithography operations to form openings to partially expose the second patterned conductive layer 13. The passivation layer 16 partially covers the top surface of the second patterned conductive layer 13 and covers the side surface of the second patterned conductive layer 13. The passivation layer 16 covers the side surface of the encapsulant 12.

Figure 11I:
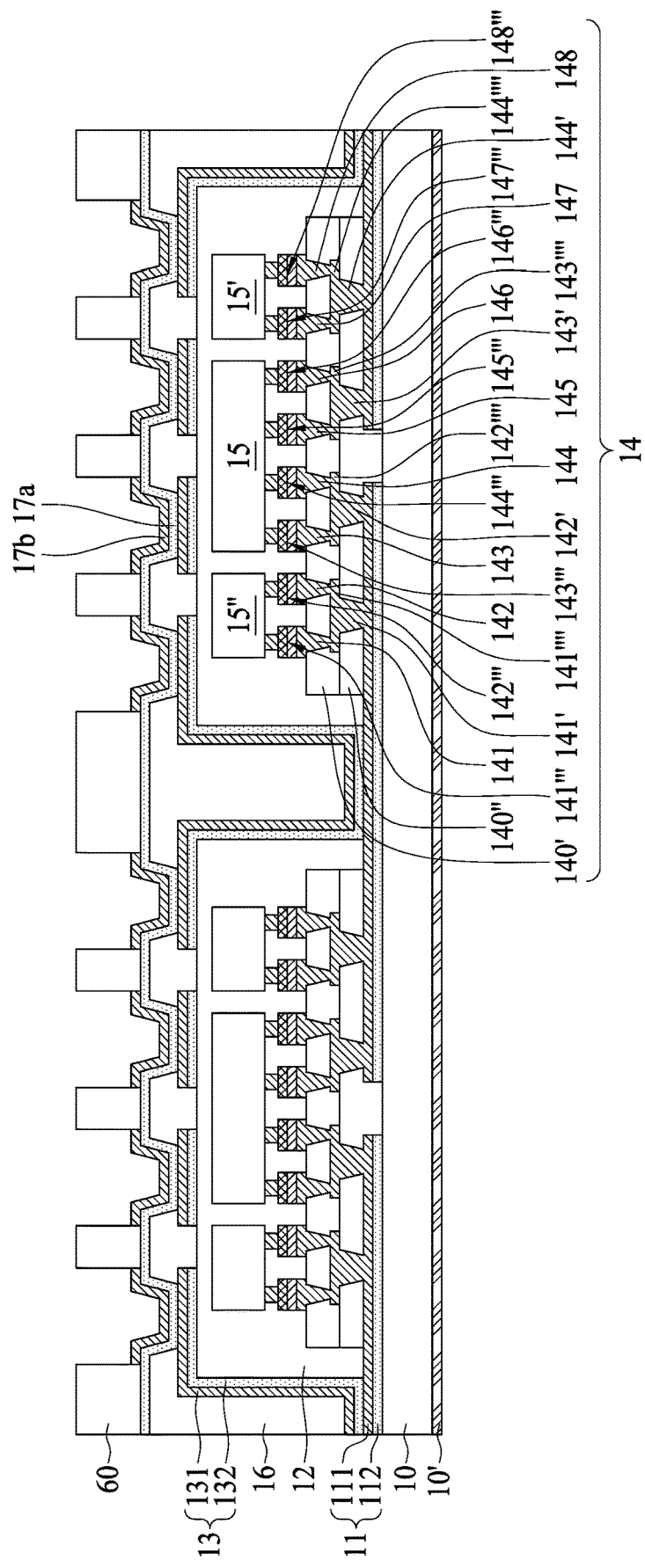
FIG. 11I illustrates an exploded perspective view of a substrate array according to some embodiments of the present disclosure.

Referring to FIG. 11I, a seed layer 17a is formed on the passivation layer 16. The seed layer 17a is formed in the openings of the passivation layer 16. A patterned photoresist 60 is provided on the seed layer 17a. A conductive layer 17b is formed on the seed layer 17a. A solder material (e.g. tin (Sn) or Ag) may be formed on the conductive layer 17b (which is not illustrated in FIG. 11I).

Figure 11J:
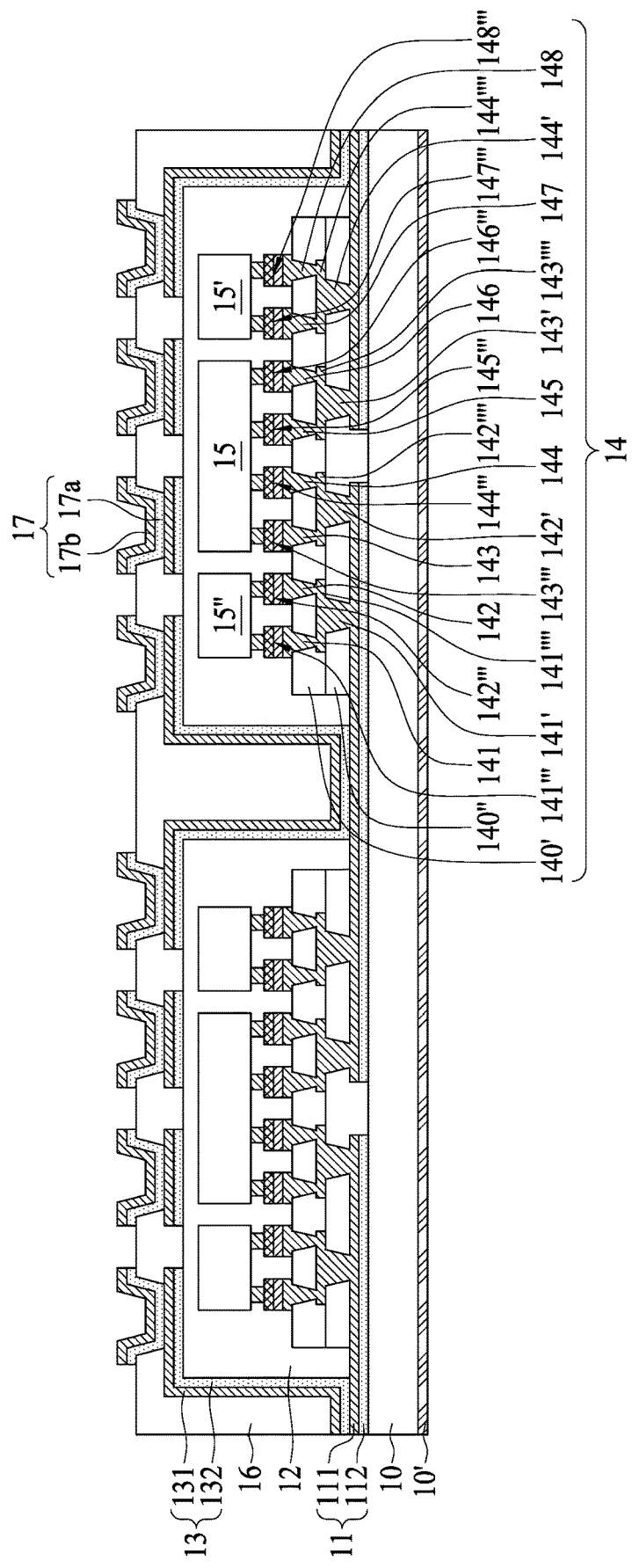
FIG. 11J illustrates a method of manufacturing a semiconductor device package according to some embodiments of the present disclosure.

Referring to FIG. 11J, the patterned photoresist 60 is removed. Then, the seed layer 17a is partially etched so as to form the conductive pad group 17.

Figure 11K:
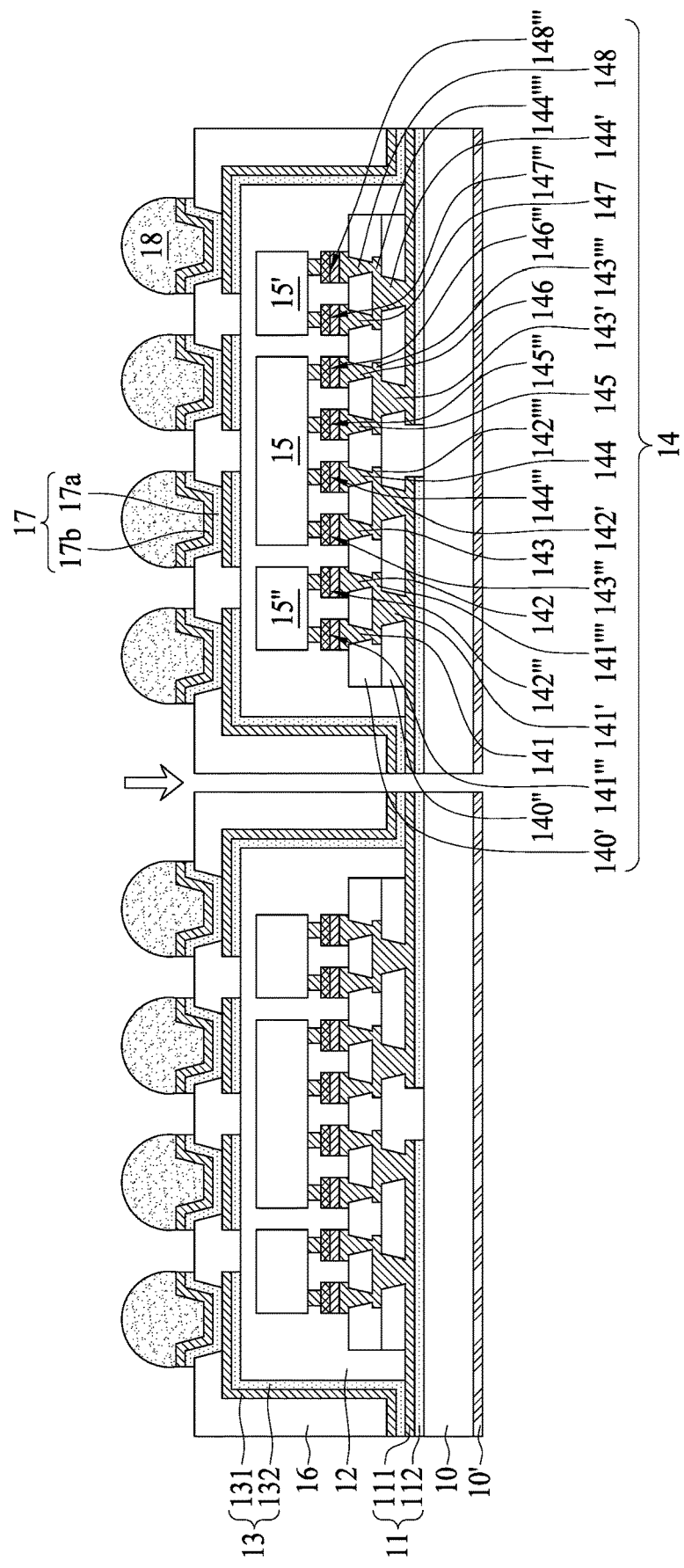
FIG. 11K illustrates a method of manufacturing a semiconductor device package according to some embodiments of the present disclosure.

Referring to FIG. 11K, external connection elements 18 are correspondingly provided on the conductive pad group 17 through the solder material. Then, a singulation operation is performed to form the semiconductor device package 1.

Figure 11L:
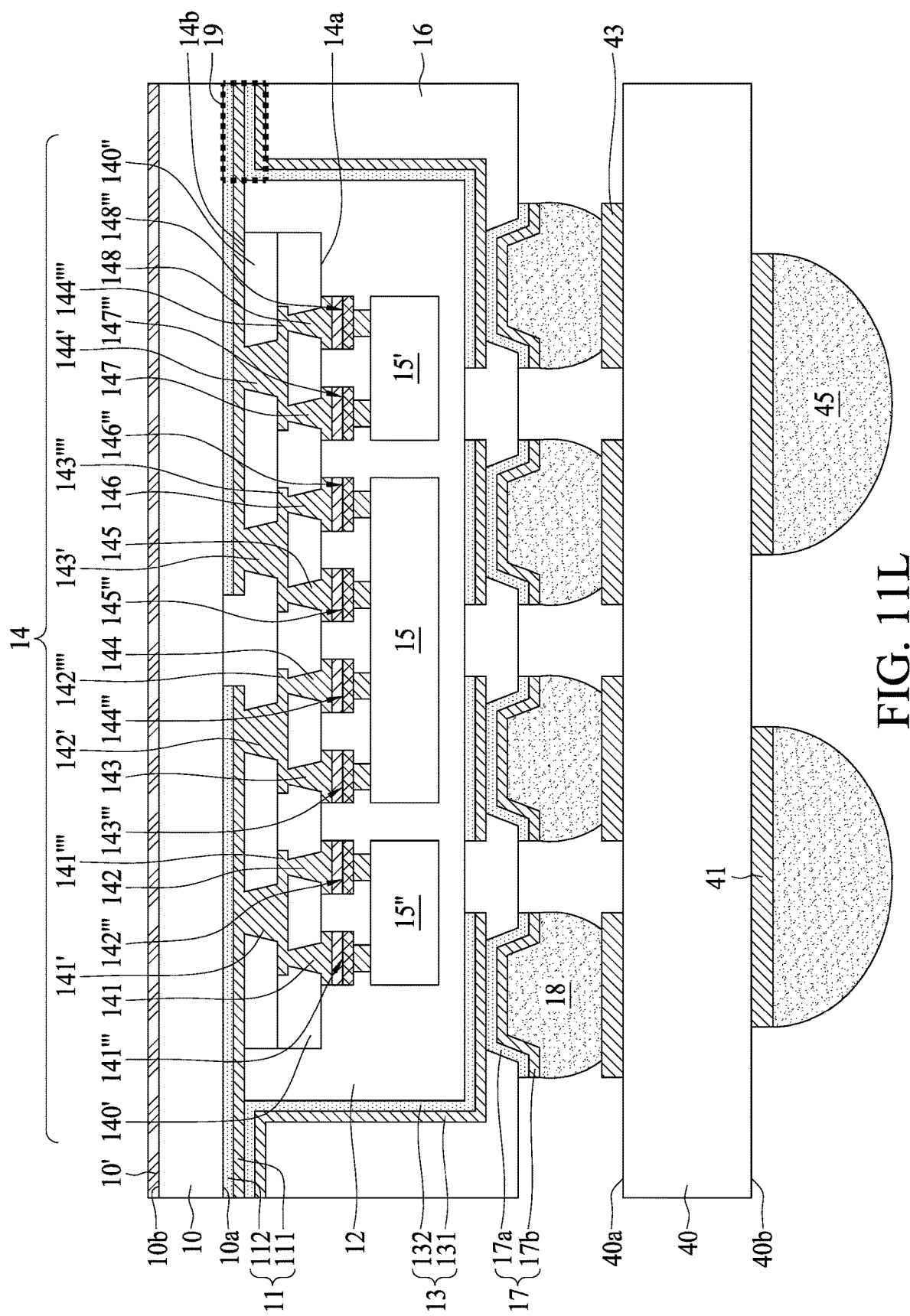
FIG. 11L illustrates a method of manufacturing a semiconductor device package according to some embodiments of the present disclosure.

Referring to FIG. 11L, the carrier 40 with the conductive pads 41, 43 and the external connection elements 45 is attached to the semiconductor device package 1 so as to form the semiconductor device package 7.

Figure 12:
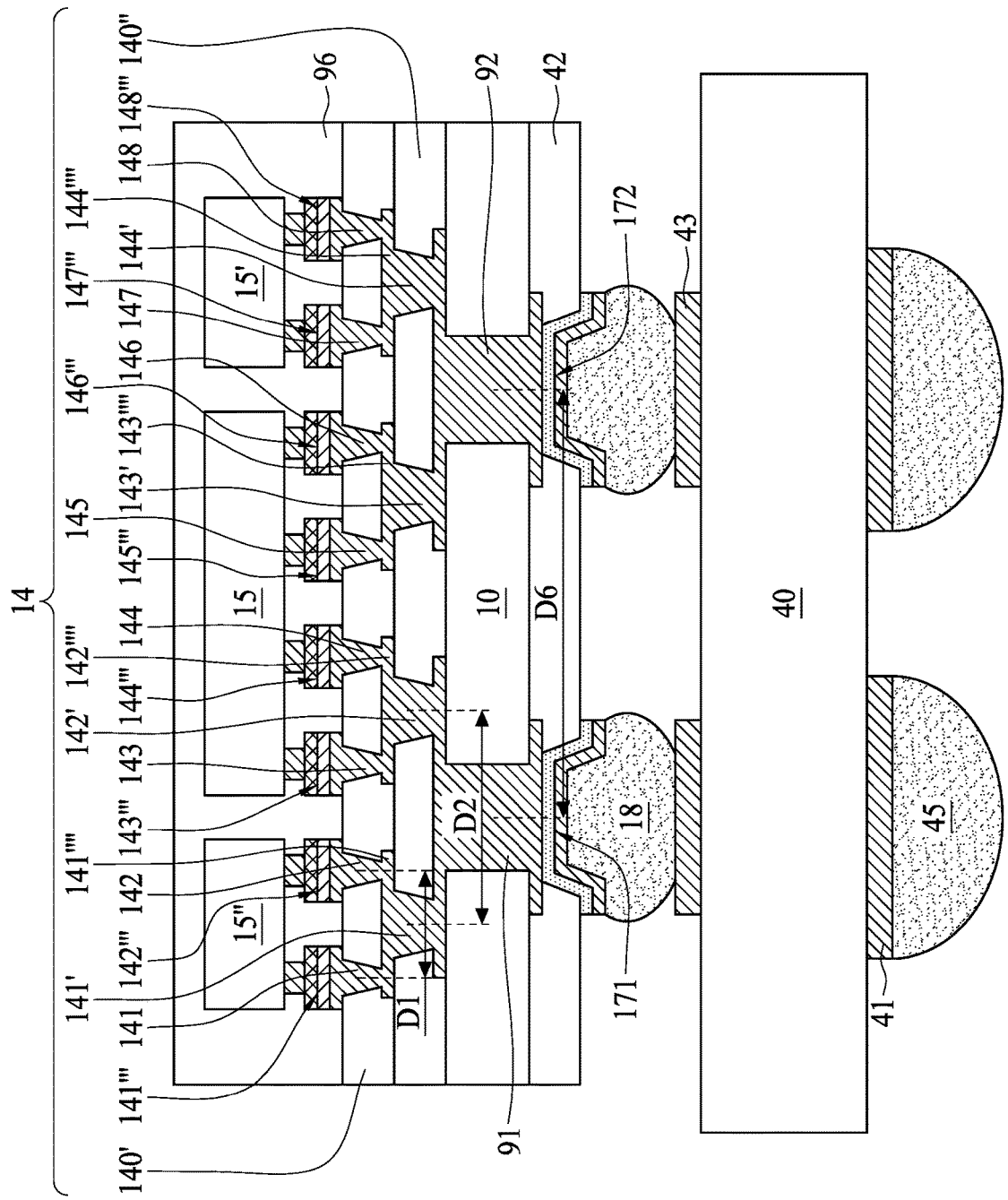
FIG. 12 illustrates a cross-sectional view of a comparative semiconductor device package according to some embodiments of the present disclosure.

FIG. 12 illustrates a cross-sectional view of a comparative semiconductor device package 9. The semiconductor device package 9 includes a carrier 10, an encapsulant 96, an interconnection structure 14, semiconductor devices 15, 15', 15'', a dielectric layer 42, conductive pads 171, 172, external connection elements 18, and a carrier 40.

The encapsulant 96 is disposed on the interconnection structure 14 to encapsulate the semiconductor devices 15, 15', 15''. The interconnection structure 14 is disposed on the carrier 10. The carrier 10 is disposed on the dielectric layer 42. The carrier 10 is able to electrically connect the semiconductor devices 15, 15', 15'' to the carrier 40. The conductive pads 171, 172 are disposed in the openings of the dielectric layer 42. The semiconductor devices 15, 15', 15'' are electrically connected to the carrier 40 through the interconnection structure 14, the carrier 10, the conductive pads 171, 172, and the external connection element 18.

Since the interconnection structure 14 includes multiple layers (which may involve a serious warpage issue), the carrier 10 may be limited to a silicon substrate for supporting the interconnection structure 14. However, the size of the silicon substrate 10 may be large for forming a TSV 91 and a TSV 92 due to material characteristics of the silicon substrate 10. Therefore, the silicon substrate 10 has a large surface area and a large thickness. The size of the TSV also may be large due to the material characteristics of the silicon substrate 10. In some embodiments, a thickness of the silicon substrate 10 may be in a range from approximately 100 μm to approximately 200 μm. A width of the TSV may be in a range from approximately 40 μm to approximately 60 μm.

Additionally, since the silicon substrate 10 may have a large size and may be disposed between the dielectric layer 42 and the interconnection structure 14, the warpage issue of the semiconductor device package can be serious and difficult to be eliminated. Also, the arrangement of electrical contacts (I/Os) has less flexibility. For example, since the TSV has a large size, it is difficult to increase a total number of electrical contacts (I/Os) in the silicon substrate 10.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be substantially, approximately, or about the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
a carrier having a first surface and a second surface opposite to the first surface;
a first patterned conductive layer adjacent to the first surface of the carrier;
an interconnection structure disposed on the first patterned conductive layer and electrically connected to the first patterned conductive layer, the interconnection structure having a side surface and a top surface;
a first semiconductor device disposed on the interconnection structure and electrically connected to the interconnection structure;
an encapsulant disposed on the first patterned conductive layer and encapsulating the first semiconductor device, the top surface of the interconnection structure, and the side surface of the interconnection structure;
a second patterned conductive layer disposed and in direct contract with on a top surface and a side surface of the encapsulant and electrically connected to the first patterned conductive layer; and
a passivation layer disposed on the second patterned conductive layer and covering the side surface of the encapsulant.

2. The semiconductor device package of claim 1, wherein the interconnection structure comprises a plurality of conductive pads, and each of the plurality of conductive pads is electrically connected to the first patterned conductive layer.

3. The semiconductor device package of claim 2, wherein the interconnection structure further comprises a wiring layer, an interconnection layer, and a dielectric layer.

4. The semiconductor device package of claim 3, wherein a width of the wiring layer is less than about 2 micrometers (μm).

5. The semiconductor device package of claim 3, wherein the wiring layer electrically connects the first semiconductor device to the first patterned conductive layer.

6. The semiconductor device package of claim 1, further comprising a second semiconductor device disposed on the interconnection structure and electrically connected to the interconnection structure, wherein the first semiconductor device is electrically connected to the second semiconductor device through the interconnection structure, and wherein the first semiconductor device and the second semiconductor device are configured to perform different functions.

7. The semiconductor device package of claim 1, wherein the first patterned conductive layer comprises a protruding portion protruding away from the encapsulant and electrically connected to the second patterned conductive layer.

8. The semiconductor device package of claim 7, wherein the second patterned conductive layer comprises a protruding portion protruding away from the encapsulant and disposed on the first patterned conductive layer, and wherein the protruding portion of the first patterned conductive layer and the protruding portion of the second patterned conductive layer form a turning pad.

9. The semiconductor device package of claim 8, wherein the turning pad comprises a first seed layer disposed on the carrier, a first metal layer disposed on the first seed layer, a second seed layer disposed on the first metal layer, and a second metal layer disposed on the second seed layer.

10. The semiconductor device package of claim 1, wherein the interconnection structure includes at least two interconnection layers.

11. The semiconductor device package of claim 1, further comprising a conductive pad, wherein the passivation layer defines an opening to partially expose the second patterned conductive layer, and the conductive pad is disposed in the opening.

12. A semiconductor device package, comprising:
a carrier having a first surface and a second surface opposite to the first surface;
a first patterned conductive layer adjacent to the first surface of the carrier;
a first interconnection layer disposed on the first patterned conductive layer and having a first pitch;
a second interconnection layer disposed on the first interconnection layer and having a second pitch;
a first semiconductor device disposed on the second interconnection layer and electrically connected to the second interconnection layer;
an encapsulant disposed on the first patterned conductive layer;
a second patterned conductive layer disposed on and in direct contact with a side surface and a top surface of the encapsulant and electrically connected to the first patterned conductive layer, the second patterned conductive layer comprising a top patterned portion on a top surface of the encapsulant, the top patterned portion having a third pitch; and
a passivation layer disposed on the second patterned conductive layer and covering the side surface and the top surface of the encapsulant;
wherein the first pitch is greater than the second pitch and the third pitch is greater than the first pitch.

13. The semiconductor device package of claim 12, further comprising a plurality of conductive pads, wherein each of the plurality of conductive pads is electrically connected to the first patterned conductive layer.

14. The semiconductor device package of claim 13, further comprising a wiring layer and a dielectric layer.

15. The semiconductor device package of claim 14, wherein a width of the wiring layer is less than about 2 μm.

16. The semiconductor device package of claim 14, wherein the wiring layer electrically connects the first semiconductor device to the first patterned conductive layer.

17. The semiconductor device package of claim 12, further comprising a second semiconductor device disposed on the second interconnection layer and electrically connected to the second interconnection layer, wherein the first semiconductor device is electrically connected to the second semiconductor device through the first interconnection layer and the second interconnection layer, and wherein the first semiconductor device and the second semiconductor device are configured to perform different functions.

18. The semiconductor device package of claim 12, wherein the first patterned conductive layer comprises a protruding portion protruding away from the encapsulant and electrically connected to the second patterned conductive layer.

19. The semiconductor device package of claim 18, wherein the second patterned conductive layer comprises a protruding portion protruding away from the encapsulant and disposed on the first patterned conductive layer, and wherein the protruding portion of the first patterned conductive layer and the protruding portion of the second patterned conductive layer form a turning pad.

20. The semiconductor device package of claim 19, wherein the turning pad comprises a first seed layer disposed on the carrier, a first metal layer disposed on the first seed layer, a second seed layer disposed on the first metal layer, and a second metal layer disposed on the second seed layer.

* * * * *